United States Patent
Nozawa et al.

(10) Patent No.: US 11,281,089 B2
(45) Date of Patent: Mar. 22, 2022

(54) MASK BLANK, METHOD FOR MANUFACTURING TRANSFER MASK, AND METHOD FOR MANUFACTURING SEMICONDUCTOR DEVICE

(71) Applicant: HOYA CORPORATION, Tokyo (JP)

(72) Inventors: Osamu Nozawa, Tokyo (JP); Ryo Ohkubo, Tokyo (JP); Hiroaki Shishido, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 400 days.

(21) Appl. No.: 16/488,901

(22) PCT Filed: Jan. 24, 2018

(86) PCT No.: PCT/JP2018/002072
§ 371 (c)(1),
(2) Date: Aug. 26, 2019

(87) PCT Pub. No.: WO2018/155047
PCT Pub. Date: Aug. 30, 2018

(65) Prior Publication Data
US 2020/0064725 A1 Feb. 27, 2020

(30) Foreign Application Priority Data

Feb. 27, 2017 (JP) .............................. JP2017-034706

(51) Int. Cl.
*G03F 1/24* (2012.01)
*H01L 21/033* (2006.01)

(52) U.S. Cl.
CPC ............ *G03F 1/24* (2013.01); *H01L 21/0332* (2013.01); *H01L 21/0337* (2013.01)

(58) Field of Classification Search
CPC ..... G03F 1/24; G03F 1/80; G03F 1/48; G03F 1/20; G03F 1/30; G03F 1/32; G03F 1/50; H01L 21/0332; H01L 21/0337; H01L 21/027
USPC ............................................................ 430/5
See application file for complete search history.

(56) References Cited

U.S. PATENT DOCUMENTS

| 5,380,608 A | 1/1995 | Miyashita et al. |
| 2007/0212618 A1 | 9/2007 | Yoshikawa et al. |

(Continued)

FOREIGN PATENT DOCUMENTS

| JP | S54-037579 A | 3/1979 |
| JP | H04-125643 A | 4/1992 |

(Continued)

OTHER PUBLICATIONS

English Translation of International Search Report dated Mar. 8, 2018, in International Application No. PCT/JP2018/002072.

(Continued)

*Primary Examiner* — Caleen O Sullivan
(74) *Attorney, Agent, or Firm* — Kilpatrick Townsend & Stockton LLP

(57) ABSTRACT

A light shielding film made up of a material containing one or more elements selected from silicon and tantalum and a hard mask film made up of a material containing chromium, oxygen, and carbon are laminated on a transparent substrate. The hard mask film is a single layer film having a composition gradient portion with increased oxygen content on the surface and on the neighboring region. The maximum peak for N1s in a narrow spectrum obtained via X-ray photoelectron spectroscopy analysis is the lower limit of detection or less. The portions excluding the composition gradient portion of the hard mask film have a 50 atom % or more chromium content, and the maximum peak for Cr2p in a narrow spectrum obtained via X-ray photoelectron spectroscopy analysis has a binding energy of 574 eV or less.

20 Claims, 10 Drawing Sheets

(56) References Cited

U.S. PATENT DOCUMENTS

| | | |
|---|---|---|
| 2014/0004449 A1 | 1/2014 | Nam et al. |
| 2015/0160549 A1 | 6/2015 | Sasamoto et al. |
| 2015/0338731 A1 | 11/2015 | Nozawa et al. |
| 2016/0187769 A1 | 6/2016 | Nozawa et al. |
| 2016/0202602 A1 | 7/2016 | Shishido et al. |
| 2016/0291453 A1 | 10/2016 | Inazuki et al. |
| 2016/0377975 A1 | 12/2016 | Matsumoto et al. |
| 2019/0040516 A1 | 2/2019 | Ohkubo et al. |

FOREIGN PATENT DOCUMENTS

| | | |
|---|---|---|
| JP | 5-289305 A | 11/1993 |
| JP | 2007-241065 A | 9/2007 |
| JP | 2014-010454 A | 1/2014 |
| JP | 2014-137388 A | 7/2014 |
| JP | 2015-111212 A | 6/2015 |
| JP | 2015-222448 A | 12/2015 |
| JP | 2016-188958 A | 11/2016 |
| JP | 2016-191784 A | 11/2016 |
| JP | 2016-191872 A | 11/2016 |
| SG | 11201803116 U | 5/2018 |
| WO | 2017/141605 A1 | 10/2018 |

OTHER PUBLICATIONS

English Translation of International Search Report dated Jun. 12, 2018, in International Application No. PCT/JP2018/014039.
U.S. Appl. No. 16/603,127, "Notice of Allowance", dated May 19, 2021, 7 pages.
SG11201909351R, "Search Report and Written Opinion", dated Apr. 23, 2020, 11 pages.

US 11,281,089 B2

MASK BLANK, METHOD FOR MANUFACTURING TRANSFER MASK, AND METHOD FOR MANUFACTURING SEMICONDUCTOR DEVICE

CROSS REFERENCE TO RELATED APPLICATIONS

This application is a National Stage of International Application No. PCT/JP2018/002072 filed Jan. 24, 2018, which claims priority to Japanese Patent Application No. 2017-034706 filed Feb. 27, 2017, and the contents of which is incorporated by reference in its entirety.

TECHNICAL FIELD

This disclosure relates to a mask blank, a method for manufacturing a transfer mask using the mask blank, and a method for manufacturing a semiconductor device using the transfer mask manufactured by the above-mentioned method. In particular, this disclosure relates to a mask blank to be suitably used in an exposure apparatus using, as an exposure light source, exposure light having a short wavelength of 200 nm or less, a method for manufacturing a transfer mask, and a method for manufacturing a semiconductor device.

BACKGROUND ART

Generally, in a manufacturing process of a semiconductor device, fine pattern formation is carried out using photolithography. For the fine pattern formation, a number of substrates called transfer masks (photomasks) are normally used. The transfer mask generally comprises a transparent glass substrate and a fine pattern formed thereon and made of a metal thin film or the like. In manufacture of the transfer mask, photolithography is used also.

The transfer mask serves as an original plate for transferring the same fine pattern in large quantities. Therefore, dimensional accuracy of the pattern formed on the transfer mask directly affects dimensional accuracy of a fine pattern to be prepared using the transfer mask. In recent years, there is a remarkable progress in miniaturization of a pattern of the semiconductor device. Correspondingly, a mask pattern formed on the transfer mask is required to be miniaturized and to have higher pattern accuracy. On the other hand, in addition to the miniaturization of the pattern on the transfer mask, there is a progress in shortening a wavelength of an exposure light source used in photolithography. Specifically, as the exposure light source upon manufacture of the semiconductor device, shortening of the wavelength advances from a KrF excimer laser (wavelength: 248 nm) to 200 nm or less, for example, an ArF excimer laser (wavelength: 193 nm).

As a type of the transfer mask, a halftone phase shift mask is known in addition to an existing binary mask comprising a transparent substrate and a light shielding film pattern formed thereon and made of a chromium-based material. In recent years, there appears a binary mask comprising a transparent substrate and a light shielding film pattern formed thereon and made of a silicon-based material or a tantalum-based material, or the like.

For the purpose of thinning a resist film formed on a surface of a mask blank, proposal has already been made of a mask blank which comprises a light shielding film and a hard mask film (may also be called an "etching mask film") formed thereon and made of a material having etch selectivity with respect to the light shielding film. For example, Patent Document 1 proposes a mask blank which comprises a light shielding film of a chromium-based material and an etching mask film formed thereon and made of a silicon-based material.

PRIOR ART DOCUMENT(S)

Patent Document(s)

Patent Document 1: JP 2014-137388 A

SUMMARY OF THE DISCLOSURE

Problem to be Solved by the Disclosure

The above-mentioned binary mask having the transparent substrate and the light shielding film pattern formed thereon and made of the silicon-based material or the tantalum-based material is manufactured using a mask blank comprising a transparent substrate and a light shielding film formed thereon and made of a silicon-based material or a tantalum-based material. In case where the mask blank has a structure in which the above-mentioned hard mask film is formed on the light shielding film, the hard mask film serves as an etching mask when a pattern is formed on the light shielding film through dry etching. Therefore, it is desirable for the hard mask film to be formed by a material having sufficient resistance against a dry etching environment of the light shielding film. For dry etching of the light shielding film made of a silicon-based material or a tantalum-based material, a fluorine-based gas is normally used as an etching gas. Accordingly, as the material of the hard mask film, it is suitable to use a material having sufficient etch selectivity with respect to the light shielding film, for example, a chromium-based material, for the dry etching using the fluorine-based gas.

In order to prepare the transfer mask (binary mask) by using the mask blank having the structure in which the light shielding film made of the silicon-based material or the tantalum-based material and the hard mask film made of the chromium-based material are laminated on the transparent substrate in this order, the following steps may be performed. At first, through dry etching using, as a mask, a resist film having a transfer pattern (the transfer pattern is a pattern to be formed on the light shielding film) and formed on a surface of the mask blank and using a mixed gas of a chlorine-based gas and an oxygen gas, a transfer pattern (hard mask film pattern) is formed on the hard mask film. Then, through dry etching using, as a mask, the hard mask film with the transfer pattern formed thereon and using the fluorine-based gas, the transfer pattern is formed on the light shielding film. Finally, the remaining hard mask film pattern is removed. Thus, the transfer mask having a light shielding film pattern formed on the transparent substrate and made of a silicon-based material or a tantalum-based material is completed.

In order that a fine pattern is formed with high accuracy on the transfer mask prepared as mentioned above, it may be necessary at least to accurately transfer the transfer pattern formed on the resist film to the hard mask film.

As described above, through the dry etching using the resist film having the transfer pattern (resist pattern) as a mask and using the mixed gas of the chlorine-based gas and the oxygen gas, the transfer pattern is formed on the hard mask film of the chromium-based material. In the dry etching using the mixed gas of the chlorine-based gas and the oxygen gas as an etching gas, a tendency of anisotropic etching is small while a tendency of isotropic etching is large. Generally, in case where a pattern is formed on a thin film through dry etching, not only etching in a thickness direction of the thin film but also etching in a side wall direction of the pattern to be formed on the thin film, i.e., so-called side etching, progresses. In order to suppress the progress of the side etching, it has already been practiced, upon dry etching, to apply a bias voltage on the side opposite to a main surface of the transparent substrate that is provided with the thin film, thereby controlling so that more etching gas is brought into contact with the film in the thickness direction thereof. In case of ion-based dry etching using an etching gas, such as a fluorine-based gas, having a high tendency to generate ionic plasma, controllability of an etching direction by applying the bias voltage is high and anisotropy of etching is enhanced. Therefore, it is possible to minimize a side etching amount of the thin film to be etched. On the other hand, in case of the dry etching using the mixed gas of the chlorine-based gas and the oxygen gas, the oxygen gas has a high tendency to generate radical plasma. Therefore, an effect of controlling the etching direction by applying the bias voltage is small and anisotropy of the etching is difficult to enhance. Accordingly, when a pattern is formed on the thin film made of the chromium-based material through dry etching using the mixed gas of the chlorine-based gas and the oxygen gas, the side etching amount tends to increase.

When the hard mask film of the chromium-based material is patterned through the dry etching using, as a mask, the resist pattern made of an organic material and using the mixed gas of the chlorine-based gas and the oxygen gas, the resist pattern is etched from an upper side to be diminished. At this time, the resist pattern is etched also in the side wall direction to be diminished so that the side etching amount tends to increase.

As means for solving the problem of the side etching in the dry etching of the thin film of the chromium-based material, it is considered to significantly increase, in the dry etching using the mixed gas of the chlorine-based gas and the oxygen gas, a mixing ratio of the chlorine-based gas in the mixed gas. This is because the chlorine-based gas has a high tendency to generate ionic plasma. However, in the dry etching using the mixed gas of the chlorine-based gas and the oxygen gas with an increased mixing ratio of the chlorine-based gas, an etching rate of the thin film of the chromium-based material is inevitably decreased. In order to supplement the decrease in etching rate of the thin film of the chromium-based material, it is also considered to significantly increase the bias voltage applied during the dry etching. In the following description, the dry etching which uses the mixed gas of the chlorine-based gas and the oxygen gas with an increased mixing ratio of the chlorine-based gas and which is carried out in a state where a high bias voltage is applied will simply be called "dry etching in a high-bias condition."

By using the dry etching in the high-bias condition, it is possible to reduce, to some extent, the side etching amount generated when the transfer pattern is formed on the thin film of the chromium-based material. Then, it is possible to form a finer transfer pattern on the thin film than before. However, when the thin film with the finer transfer pattern formed thereon is observed by a CD-SEM (Critical Dimension-Scanning Electron Microscope), it is newly found out that, in case of a pattern width of the above-mentioned thin film, LWR (Line Width Roughness) has a value which becomes a problem. Herein, LWR represents a variation in pattern width caused by variation (fluctuation) of left and right line edges in a line pattern.

When the value of LWR of the transfer pattern formed on the hard mask film of the chromium-based material with the resist pattern used as a mask is large, the pattern accuracy of the light shielding film is decreased when the transfer pattern is formed on the light shielding film using, as a mask, the hard mask film provided with the transfer pattern. This affects the accuracy of a device pattern in a semiconductor device manufactured by using the transfer mask and may possibly lead to a serious defect. However, if it is possible to further reduce the side etching amount generated in the dry etching in the high-bias condition when the fine transfer pattern is formed on the hard mask film, it is possible to reduce LWR of the fine transfer pattern formed on the hard mask film through the dry etching.

This disclosure has been made in order to solve the above-mentioned existing problems. A first aspect of this disclosure is to provide a mask blank which has a structure such that a light shielding film made of a silicon-based material or a tantalum-based material and a hard mask film made of a chromium-based material are laminated on a transparent substrate in this order, and which is capable of reducing a side etching amount generated on a pattern side wall of the hard mask film and reducing LWR even in case where the hard mask film is patterned through dry etching in a high-bias condition using, as a mask, a resist film having a pattern to be formed on a light shielding film and using a mixed gas of a chlorine-based gas and an oxygen gas, thereby accurately forming a fine transfer pattern on the hard mask film. Furthermore, an aspect of this disclosure is to provide the mask blank capable of accurately forming a fine pattern also on the light shielding film by patterning the light shielding film using, as a mask, the hard mask film provided with the transfer pattern.

A second aspect of this disclosure is to provide a method for manufacturing a transfer mask provided with a high-accuracy fine transfer pattern by using the mask blank.

A third aspect of this disclosure is to provide a method for manufacturing a semiconductor device capable of carrying out, by using the transfer mask, high-accuracy pattern transfer onto a resist film on a semiconductor substrate.

Means to Solve the Problem

In order to solve the above-mentioned problems, the present inventors focused particularly on analyzing a depth direction chemical bonding state of the thin film and continued an intensive study to complete this disclosure. Specifically, in order to solve the above-mentioned problems, this disclosure has the following configurations.

(Configuration 1)

A mask blank having a structure in which a light shielding film and a hard mask film are laminated on a transparent substrate in this order, wherein the light shielding film is made of a material containing one or more elements selected from silicon and tantalum; the hard mask film is a single layer film having a composition gradient portion formed on a surface of the hard mask film that faces away from the light shielding film and a region adjacent thereto, the hard mask film is made of a material containing chromium, oxygen, and carbon;

a part of the hard mask film excluding the composition gradient portion has a chromium content of 50 atomic % or more, the hard mask film has a maximum peak of N1s narrow spectrum, obtained by analysis of X-ray photoelectron spectroscopy, which is not higher than a lower detection limit, and the part of the hard mask film excluding the composition gradient portion has a maximum peak of Cr2p narrow spectrum, obtained by analysis of X-ray photoelectron spectroscopy, at a binding energy of 574 eV or less.

(Configuration 2)

The mask blank according to configuration 1, wherein a ratio of a carbon content [atomic %] divided by a total content [atomic %] of chromium, carbon, and oxygen in the part of the hard mask film excluding the composition gradient portion is 0.1 or more.

(Configuration 3)

The mask blank according to configuration 1 or 2, wherein the composition gradient portion of the hard mask film has a maximum peak of Cr2p narrow spectrum, obtained by analysis of X-ray photoelectron spectroscopy, at a binding energy of 576 eV or more.

(Configuration 4)

The mask blank according to any one of configurations 1 to 3, wherein the hard mask film has a maximum peak of Si2p narrow spectrum, obtained by analysis of X-ray photoelectron spectroscopy, which is not higher than a lower detection limit.

(Configuration 5)

The mask blank according to any one of configurations 1 to 4, wherein the part of the hard mask film excluding the composition gradient portion has a chromium content of 80 atomic % or less.

(Configuration 6)

The mask blank according to any one of configurations 1 to 5, wherein the part of the hard mask film excluding the composition gradient portion has a carbon content of 10 atomic % or more and 20 atomic % or less.

(Configuration 7)

The mask blank according to any one of configurations 1 to 6, wherein the part of the hard mask film excluding the composition gradient portion has an oxygen content of 10 atomic % or more and 35 atomic % or less.

(Configuration 8)

The mask blank according to any one of configurations 1 to 7, wherein the part of the hard mask film excluding the composition gradient portion has a difference in content of each constituent element in a thickness direction that is less than 10 atomic %.

(Configuration 9)

The mask blank according to any one of configurations 1 to 8, wherein the light shielding film has an optical density not smaller than 2.8 with respect to exposure light of an ArF excimer laser (having a wavelength of 193 nm).

(Configuration 10)

The mask blank according to any one of configurations 1 to 9, wherein the light shielding film has a thickness of 60 nm or less.

(Configuration 11)

The mask blank according to any one of configurations 1 to 10, wherein the hard mask film has a thickness of 15 nm or less.

(Configuration 12)

A method for manufacturing a transfer mask using the mask blank according to any one of configurations 1 to 11, comprising the step of forming a transfer pattern on the hard mask film through dry etching using, as a mask, a resist film having a transfer pattern and using a mixed gas of a chlorine-based gas and an oxygen gas; and the step of forming a transfer pattern on the light shielding film through dry etching using, as a mask, the hard mask film provided with the transfer pattern and using a fluorine-based gas.

(Configuration 13)

A method for manufacturing a semiconductor device, comprising the step of exposure-transferring a transfer pattern onto a resist film on a semiconductor substrate by using a transfer mask manufactured by the method for manufacturing a transfer mask according to configuration 12.

Effect of the Disclosure

According to the mask blank of this disclosure having the above-mentioned configurations, the mask blank has a structure in which a light shielding film made of a silicon-based material or a tantalum-based material and a hard mask film made of a chromium-based material are laminated on a transparent substrate in this order. With the mask blank, even if the hard mask film is patterned through dry etching in a high-bias condition using, as a mask, a resist film having a pattern to be formed on the light shielding film and using a mixed gas of a chlorine-based gas and an oxygen gas, it is possible to reduce a side etching amount generated on a pattern side wall of the hard mask film and to reduce LWR also. Thus, it is possible to accurately form a fine transfer pattern on the hard mask film. Furthermore, by patterning the light shielding film using, as a mask, the hard mask film provided with the transfer pattern, it is possible to accurately form a fine pattern on the light shielding film also. In addition, by using the mask blank, it is possible to manufacture a transfer mask provided with a high-accuracy fine transfer pattern. Furthermore, by carrying out pattern transfer on a resist film of a semiconductor substrate using the transfer mask, it is possible to manufacture a high-quality semiconductor device provided with a device pattern excellent in pattern accuracy.

MODE FOR EMBODYING THE DISCLOSURE

Figure 1:
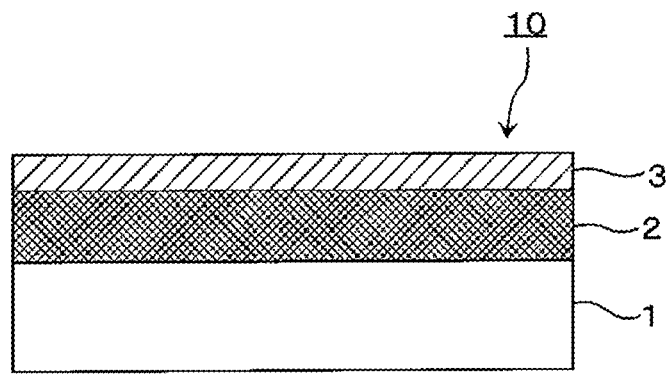
FIG. 1 is a schematic sectional view of a mask blank according to one embodiment of this disclosure.

Hereinafter, embodiments of this disclosure will be described in detail with reference to the drawings.

At first, a history how to reach this disclosure will be described.

In dry etching in a high-bias condition for a chromium-based material film, an etching rate of etching in a film thickness direction can considerably be increased as compared with dry etching at a normal bias voltage using the same condition of etching gas (hereinafter will be called "dry etching in a normal condition"). Generally, upon dry etching of a thin film, both dry etching by a chemical reaction and dry etching by a physical action are carried out. The dry etching by the chemical reaction is carried out in a process that an etching gas in a plasma state is brought into contact with a surface of the thin film and is bonded to metal elements in the thin film to generate a low-boiling-point compound to be sublimated. On the other hand, the dry etching by the physical action is carried out in a process that ionic plasma in an etching gas accelerated by a bias voltage collides with a surface of a thin film to physically eject respective elements, including metal elements, on the surface of the thin film, to generate a low-boiling-point compound with the metal elements that is sublimated.

In the dry etching in the high-bias condition, the dry etching by the physical action is enhanced as compared with the dry etching in the normal condition. The dry etching by the physical action significantly contributes to etching in the film thickness direction but does not much contribute to etching in a side wall direction of a pattern. On the other hand, the dry etching by the chemical reaction contributes to both the etching in the film thickness direction and the etching in the side wall direction of the pattern. Therefore, in order to reduce a side etching amount than before, it may be desirable to reduce easiness of being dry-etched by the chemical reaction in the chromium-based material film than before and to maintain easiness of being dry-etched by the physical action to a same level as before.

In order to reduce the etching amount according to the dry etching by the chemical reaction in the chromium-based material film, for example, it is proposed to increase a chromium content in the chromium-based material film. However, if the chromium content in the chromium-based material film is too large, the etching amount by the physical action becomes significantly small and the etching rate of the chromium-based material film is significantly decreased. When the etching rate of the chromium-based material film is significantly decreased, an etching time becomes considerably long when the chromium-based material film is patterned, and a side wall of the pattern is exposed to the etching gas for a longer time duration. This leads to an increase of the side etching amount. Therefore, the technique of simply increasing the chromium content in the chromium-based material film significantly decreases the etching rate of the film and is not relevant to suppression of the side etching amount.

In view of the above, the present inventors studied about constituent elements in the chromium-based material film other than chromium. In order to suppress the side etching amount, it is effective to contain light elements which consume oxygen radicals promoting the dry etching by the chemical reaction. It may be desirable for a material forming a hard mask film in this disclosure to have at least chemical resistance during cleaning. Therefore, the light elements which can be contained in a predetermined amount or more in a chromium-based material forming the hard mask film are limited. The light elements which can be contained in a predetermined amount or more in the chromium-based material include oxygen, nitrogen, carbon, and so on.

For example, by making oxygen be contained in the chromium-based material forming the hard mask film in this disclosure, the etching rate is considerably increased in both the dry etching in the high-bias condition and the dry etching in the normal condition. Simultaneously, side etching tends to easily progress. However, taking into account that the hard mask film generally has a thickness of 15 nm or less and that the etching time in the film thickness direction is significantly shortened, it may be required for oxygen to be contained in the chromium-based material forming the hard mask film in case of the dry etching in the high-bias condition.

When the chromium-based material forming the hard mask film contains nitrogen, the etching rate is increased in both the dry etching in the high-bias condition and the dry etching in the normal condition, although not so remarkable as compared with the case of containing oxygen. Simultaneously, however, the side etching tends to easily progress. When the chromium-based material contains nitrogen, the easiness in progress of the side etching is increased as compared with the degree of shortening the etching time in the film thickness direction. Taking the above into account, it is desired that, in case of the dry etching in the high-bias condition, the chromium-based material forming the hard mask film does not contain nitrogen.

In case of the dry etching in the normal condition, when the chromium-based material contains carbon, the etching rate is slightly decreased as compared with the case of a hard mask film consisting of chromium only. However, if the chromium-based material contains carbon, resistance against the dry etching by the physical action is lowered as compared with the case of the hard mask film consisting of chromium only. Therefore, in case of the dry etching in the high-bias condition having a great tendency of the dry etching by the physical action, if the chromium-based material contains carbon, the etching rate is increased as compared with the case of the hard mask film consisting of chromium only. When the chromium-based material contains carbon, the oxygen radicals promoting the side etching are consumed. Therefore, as compared with the case where oxygen or nitrogen is contained, the side etching is difficult to progress. Taking the above into account, in case of the dry etching in the high-bias condition, it may be required for carbon to be contained in the chromium-based material forming the hard mask film.

The above-mentioned significant difference arises between the case where nitrogen is contained in the chromium-based material and the case where carbon is contained in the chromium-based material. This results from a difference between Cr—N bond and Cr—C bond. Cr—N bond has a low binding energy and dissociation of the bond tends to easily occur. Therefore, if chlorine and oxygen in a plasma state are brought into contact, Cr—N bond is easily dissociated to form chromyl chloride having a low boiling point. On the other hand, Cr—C bond has a high binding energy and dissociation of the bond is difficult to occur. Therefore, even if chlorine and oxygen in a plasma state are brought into contact, Cr—C bond is difficult to be dissociated to form chromyl chloride having a low boiling point.

As described above, the etching in the high-bias condition has a great tendency of the dry etching by the physical action. In the dry etching by the physical action, the elements in the thin film are ejected by ion bombardment to cause a state where the bond between the elements is broken. Therefore, a difference in easiness of formation of chromyl chloride resulting from a difference in level of the binding energy between the elements is small as compared with the case of the dry etching by the chemical reaction. As described above, the dry etching by the physical action significantly contributes to the etching in the film thickness direction but does not much contribute to the etching in the side wall direction of the pattern. Therefore, in the dry etching in the high-bias condition in the film thickness direction of the hard mask film made of the chromium-based material, a difference in degree of progress of the etching is small between Cr—N bond and Cr—C bond.

In comparison, in the side etching advancing in the side wall direction of the pattern, the tendency of the dry etching by the chemical reaction is high. Therefore, if an abundance ratio of Cr—N bond in the chromium-based material forming the hard mask film is high, the side etching tends to easily progress. On the other hand, if an abundance ratio of Cr—C bond in the chromium-based material forming the hard mask film is high, the side etching is difficult to progress.

The present inventors comprehensively considered the above matters and further focused on analyzing a chemical bonding state in the depth direction of the thin film. As a result, it is concluded that, in order to solve the above-mentioned problems, the hard mask film patterned by the dry etching in the high-bias condition using, as a mask, the resist film having a pattern to be formed on the light shielding film is desired to have a following structure. The hard mask film is a single layer film having a composition gradient portion increased in oxygen content and formed on a surface of the hard mask film that faces away from the light shielding film and in a region adjacent thereto. The hard mask film is made of a material containing chromium, oxygen, and carbon. A part of the hard mask film excluding the composition gradient portion has a chromium content of 50 atomic % or more. The hard mask film has a maximum peak of N1s narrow spectrum, obtained by analysis of X-ray photoelectron spectroscopy, which is not higher than a lower detection limit. The part of the hard mask film excluding the composition gradient portion has a maximum peak of Cr2p narrow spectrum, obtained by analysis of X-ray photoelectron spectroscopy, at a binding energy of 574 eV or less. Thus, this disclosure has been completed.

Now, this disclosure will be described in detail on the basis of embodiments.

FIG. 1 is a schematic sectional view for illustrating a mask blank according to one embodiment of this disclosure.

As illustrated in FIG. 1, the mask blank 10 according to the one embodiment of this disclosure has a structure in which a light shielding film 2 and a hard mask film 3 are laminated on a transparent substrate 1 in this order.

Herein, the transparent substrate 1 in the mask blank 10 is not particularly limited as far as the substrate is for use in a transfer mask for manufacture of a semiconductor device. The transparent substrate is not particularly limited as far as the substrate is transparent with respect to an exposure wavelength used in exposure transfer of a pattern onto a semiconductor substrate during manufacture of the semiconductor device. A synthetic quartz substrate and other various types of glass substrates (for example, soda lime glass, aluminosilicate glass, and so on) may be used. Among others, the synthetic quartz substrate is particularly preferably used because it is highly transparent to an ArF excimer laser (wavelength: 193 nm) effective in fine pattern formation or in a region of a shorter wavelength.

It may be desirable for the hard mask film 3 to be a material having high etch selectivity with respect to the light shielding film 2 directly thereunder. In this disclosure, by selecting a chromium-based material as a material of the hard mask film 3, it is possible to secure high etch selectivity with respect to the light shielding film 2 made of a silicon-based material or a tantalum-based material. Therefore, it is possible not only to thin a resist film to be formed on a surface of the mask blank 10 but also to reduce the thickness of the hard mask film 3. In this disclosure, since the hard mask film 3 has the above-mentioned structure, it is possible to accurately transfer, onto the hard mask film 3, a fine transfer pattern of the resist film formed on the surface of the mask blank 10.

Next, the structure of the hard mask film 3 in this disclosure will be described further in detail. The hard mask film 3 is made of a material containing chromium (Cr), oxygen (O), and carbon (C). The hard mask film 3 is a single layer film having a composition gradient portion increased in oxygen content and formed on a surface of the hard mask film 3 that faces away from the light shielding film 2 and in a region adjacent thereto.

When the completed mask blank 10 is placed in an atmosphere containing oxygen, for example, in the air, a region where the oxygen content is increased as compared with the other part is formed on the surface of the hard mask film 3 as the surface of the mask blank 10 and in the vicinity thereof. The oxygen content is highest at the surface of the hard mask film 3 directly exposed to the atmosphere containing oxygen and moderately lowers inward, away from the surface. Away from the surface by a certain distance, a composition of the hard mask film 3 becomes substantially constant. In this disclosure, the region which is formed on the surface of the hard mask film 3 and in the region adjacent thereto and which has the oxygen content greater than that in the other part but moderately decreasing away from the surface is represented as the composition gradient portion. A part of the hard mask film 3 excluding the composition gradient portion (i.e., a region excluding the composition gradient portion) has a substantially constant composition. Specifically, a difference in content of each constituent component in the thickness direction is preferably smaller than 10 atomic %, more preferably equal to 8 atomic % or less, and further preferably equal to 5 atomic % or less with respect to any constituent element.

In this disclosure, the part of the hard mask film 3 excluding the composition gradient portion has a chromium content of 50 atomic % or more. If the chromium content is 50 atomic % or more, it is possible to suppress side etching caused when the hard mask film 3 is patterned by the dry etching in the high-bias condition using, as a mask, the resist film having the transfer pattern and formed on the surface of the mask blank 10. Furthermore, it is possible to reduce LWR of the transfer pattern formed on the hard mask film 3 by the dry etching.

The part of the hard mask film 3 excluding the composition gradient portion preferably has a chromium content of 80 atomic % or less. If the chromium content is greater than 80 atomic %, an etching rate is significantly decreased when the hard mask film 3 is patterned by the dry etching in the high-bias condition. Therefore, in order to sufficiently secure the etching rate when the hard mask film 3 is patterned by the dry etching in the high-bias condition, the part of the hard mask film 3 excluding the composition gradient portion preferably has a chromium content of 80 atomic % or less as described above.

In this disclosure, the hard mask film 3 has a maximum peak of N1s narrow spectrum, obtained by analysis of X-ray photoelectron spectroscopy (XPS), which is not higher than a lower detection limit.

If the peak of N1s narrow spectrum exists, Cr—N bond exists in the chromium-based material forming the hard mask film 3 at a predetermined ratio or more. If Cr—N bond exists in the material forming the hard mask film 3 at the predetermined ratio or more, it is difficult to suppress the progress of side etching when the hard mask film 3 is patterned by the dry etching in the high-bias condition. In this disclosure, the content of nitrogen (N) in the hard mask film 3 is desirably equal to or less than a detection limit value.

In this disclosure, the part of the hard mask film 3 excluding the composition gradient portion has a maximum peak of Cr2p narrow spectrum, obtained by the analysis of X-ray photoelectron spectroscopy, at a binding energy of 574 eV or less.

In case where the chromium-based material is in the state where Cr2p narrow spectrum has a maximum peak at a binding energy higher than 574 eV, i.e., in the state of chemical shift, this represents a state where an abundance ratio of chromium atoms bonded to other atoms (particularly, nitrogen) is high. Such a chromium-based material tends to have low resistance against dry etching by a chemical reaction contributing to etching in a side wall direction of a pattern. Therefore, it is difficult to suppress the progress of the side etching. In comparison, in case where the part of the hard mask film 3 excluding the composition gradient portion is made of a chromium-based material having a maximum peak of Cr2p narrow spectrum, obtained by analysis of X-ray photoelectron spectroscopy, at a binding energy of 574 eV or less as in this disclosure, it is possible to suppress the progress of the side etching when the hard mask film 3 is patterned by the dry etching in the high-bias condition. Furthermore, it is possible to reduce LWR of the transfer pattern formed on the hard mask film 3 by the dry etching.

In this disclosure, a ratio of the content [atomic %] of carbon in the part of the hard mask film 3 excluding the composition gradient portion divided by the total content [atomic %] of chromium, carbon, and oxygen is preferably equal to 0.1 or more, more preferably equal to or 0.14 or more. In this disclosure, the hard mask film 3 is made of a material containing chromium, oxygen, and carbon. Most of chromium in the hard mask film 3 exists in any of the form of Cr—O bond, the form of Cr—C bond, and the form of no bond with either oxygen or carbon. Therefore, in the chromium-based material with a high ratio of the content [atomic %] of carbon divided by the total content [atomic %] of chromium, carbon, and oxygen, an abundance ratio of Cr—C bond in the material is high. Therefore, it is possible to suppress the progress of side etching when such chromium-based material is patterned by the dry etching in the high-bias condition. Furthermore, it is possible to reduce LWR of the transfer pattern formed on the hard mask film 3 by the dry etching. The ratio of the content [atomic %] of carbon in the part of the hard mask film 3 excluding the composition gradient portion divided by the total content [atomic %] of chromium and carbon is preferably equal to or more than 0.14, more preferably equal to or more than 0.16.

As described above, the hard mask film 3 is made of the material containing chromium, oxygen, and carbon. The total content of chromium, oxygen, and carbon is preferably equal to 95 atomic % or more, more preferably equal to 98 atomic % or more. Particularly preferably, the hard mask film 3 is made of chromium, oxygen, and carbon mentioned above, except for impurities inevitably mixed during film formation. Herein, the inevitably mixed impurities include those elements contained in a sputtering gas when the hard mask film 3 is formed by sputtering, for example, argon, helium, neon, krypton, xenon, hydrogen, and so on.

In this disclosure, the part of the hard mask film 3 excluding the composition gradient portion preferably has an oxygen content not smaller than 10 atomic % and not greater than 35 atomic %. By containing oxygen in the chromium-based material forming the hard mask film 3 at the content within the above-mentioned range, the etching rate in case of the dry etching in the high-bias condition is considerably increased so as to considerably shorten the etching time in the film thickness direction.

The part of the hard mask film 3 excluding the composition gradient portion has a carbon content not smaller than 10 atomic % and not greater than 20 atomic %. By containing carbon in the chromium-based material forming the hard mask film 3 at the content within the above-mentioned range, it is possible to increase the etching rate in case of the dry etching in the high-bias condition and to suppress the progress of side etching. Furthermore, it is possible to reduce LWR of the transfer pattern to be formed on the hard mask film 3 by the dry etching.

Preferably, the composition gradient portion of the hard mask film 3 has a maximum peak of Cr2p narrow spectrum, obtained by analysis of X-ray photoelectron spectroscopy, at a binding energy of 576 eV or more.

Preferably, the hard mask film 3 has a maximum peak of Si2p narrow spectrum, obtained by analysis of X-ray photoelectron spectroscopy, which is not higher than a lower detection limit. If the peak of Si2p narrow spectrum exists, unbonded silicon or silicon bonded to other atoms exist at a predetermined ratio or more in the material forming the hard mask film 3. Such material is not desirable because the etching rate with respect to the dry etching using a mixed gas of a chlorine-based gas and an oxygen gas tends to decrease. Therefore, in the hard mask film 3, the content of silicon is preferably equal to 1 atomic % or less, desirably not higher than a lower detection limit.

Although a method for forming the hard mask film 3 need not be particularly limited, sputtering film formation is preferable among others. The sputtering film formation is favorable because a uniform film with a constant thickness can be formed. Since a highly conductive target is used in formation of the hard mask film 3, it is more preferable to use DC sputtering having a relatively high film formation rate.

The thickness of the hard mask film 3 need not be particularly limited but, generally, is preferably equal to 15 nm or less. The hard mask film 3 serves as an etching mask when the light shielding film 2 directly thereunder is patterned by dry etching using a fluorine-based gas. Therefore, it may be desirable for the hard mask film to have a thickness at least to the extent that the hard mask film does not disappear before completion of etching of the light shielding film 2 directly thereunder. On the other hand, if the thickness of the hard mask film 3 is large, it is difficult to thin the resist pattern directly thereon. From this point of view, the thickness of the hard mask film 3 in this disclosure is more preferably within a range, for example, not smaller than 3 nm and not greater than 15 nm, further preferably not smaller than 3.5 nm and not greater than 10 nm.

Next, the light shielding film 2 will be described.

In this disclosure, the light shielding film 2 is made of a material containing one or more elements selected from silicon and tantalum.

In this disclosure, by selecting the chromium-based material as a material of the hard mask film 3, it is possible to secure high etch selectivity with respect to the light shielding film 2 made of the silicon-based material or the tantalum-based material.

As the material forming the light shielding film 2 and containing one or more elements selected from silicon and tantalum, the following materials are presented in this disclosure.

As a material containing silicon, a material consisting of silicon and nitrogen, or a material further containing one or more elements selected from metalloid elements and non-metal elements in addition to the above-mentioned material is preferable. As the metalloid elements in this case, one or more elements selected from boron, germanium, antimony, and tellurium are preferable. The non-metal elements in this case include non-metal elements in a narrow sense (nitrogen, carbon, oxygen, phosphorus, sulfur, and selenium), halogen, and noble gas.

Other materials containing silicon and suitable for the light shielding film 2 include a material containing, in addition to silicon and transition metal, one or more elements selected from oxygen, nitrogen, carbon, boron, and hydrogen. The transition metal in this case includes, for example, molybdenum (Mo), tungsten (W), titanium (Ti), tantalum (Ta), zirconium (Zr), hafnium (Hf), niobium (Nb), vanadium (V), cobalt (Co), nickel (Ni), ruthenium (Ru), tin (Sn), chromium (Cr), and so on. Such a material containing silicon and transition metal has a high light shielding performance so that the thickness of the light shielding film 2 can be reduced.

As a material containing tantalum, a material containing tantalum and one or more element selected from nitrogen, oxygen, boron, and carbon is used in addition to tantalum metal. Specifically, for example, Ta, TaN, TaO, TaON, TaBN, TaBO, TaBON, TaCN, TaCO, TaCON, TaBCN, TaBOCN, and so on are preferable.

Although a method for forming the light shielding film 2 need not be particularly limited, sputtering film formation is preferable among others. The sputtering film formation is favorable because a uniform film with a constant thickness can be formed. When the light shielding film 2 is made of a material consisting of silicon and nitrogen, or a material containing one or more elements selected from metalloid elements and non-metal elements in addition to the above-mentioned material, film formation is preferably carried out using RF sputtering or ion beam sputtering because a target has low conductivity. On the other hand, when the light shielding film 2 is made of a material containing, in addition to silicon and transition metal, one or more elements selected from oxygen, nitrogen, carbon, boron, and hydrogen or a material containing tantalum, film formation is preferably carried out using DC sputtering having a relatively high film formation rate because a target has relatively high conductivity.

The light shielding film 2 may have a single layer structure or a multilayer structure. For example, the light shielding film may have a double layer structure comprising a light shielding layer and a surface reflection prevention layer, or a three layer structure further comprising a back surface reflection prevention layer.

It may be desirable for the light shielding film 2 to secure predetermined light shieldability, for example, to have an optical density (OD), which is equal to 2.8 or more, preferably equal to 3.0 or more, with respect to exposure light of an ArF excimer laser (wavelength: 193 nm) effective for fine pattern formation.

The thickness of the light shielding film 2 need not be particularly limited but is preferably equal to 80 nm or less, more preferably equal to 70 nm or less, in order to accurately form a fine pattern. On the other hand, since it may be desirable for the light shielding film 2 to secure predetermined light shieldability (optical density) as described above, the thickness of the light shielding film 2 is preferably equal to 30 nm or more, more preferably equal to 40 nm or more.

As regards the mask blank 10 mentioned above, description has been made about the structure in which no other film is formed between the transparent substrate 1 and the light shielding film 2. However, the mask blank in this disclosure is not limited thereto. The mask blank of this disclosure includes a mask blank having a multilayer structure comprising an etching stopper film between the transparent substrate 1 and the light shielding film 2 mentioned above. A material of the etching stopper film in this case includes a material containing chromium, a material containing aluminum and oxygen, a material containing aluminum, silicon, and oxygen, and so on. The mask blank of this disclosure also includes a mask blank having a multilayer structure comprising a light semi-transmitting film (halftone phase shift film or the like) between the transparent substrate 1 and the light shielding film 2 mentioned above. When the light semi-transmitting film and the light shielding film 2 are made of materials to be dry-etched by the same fluorine-based gas, an etching stopper film is preferably formed between the light semi-transmitting film and the light shielding film 2. A suitable material forming the etching stopper film in this case is similar to those mentioned above.

The mask blank of this disclosure includes a configuration including a resist film on the surface of the mask blank 10 mentioned above.

Figure 2:
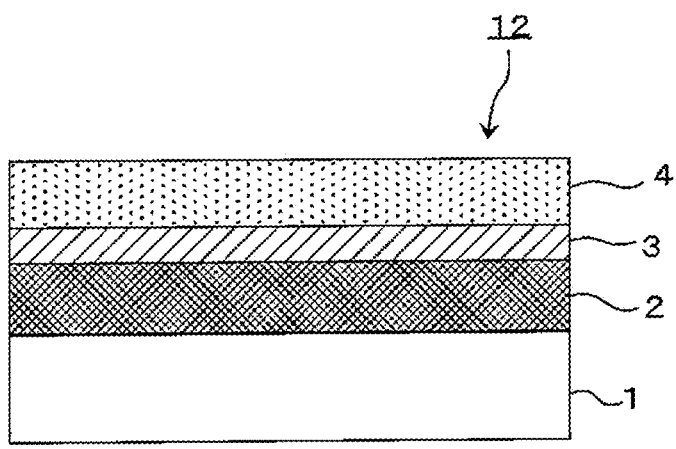
FIG. 2 is a schematic sectional view of a mask blank according to another embodiment of this disclosure.

FIG. 2 is a schematic sectional view for illustrating a mask blank according to another embodiment of this disclosure. Parts equivalent to those in FIG. 1 are depicted by the same reference numerals.

As shown in FIG. 2, the mask blank 12 according to another embodiment of this disclosure has a structure in which a light shielding film 2 and a hard mask film 3 are laminated on a transparent substrate 1 in this order, and a resist film 4 is formed on the hard mask film 3. The transparent substrate 1, the light shielding film 2, and the hard mask film 3 of the mask blank 12 are similar to those of the above-mentioned mask blank 10 in FIG. 1 and, therefore, description thereof will be omitted herein. The resist film 4 is made of an organic material. A resist material for electron beam writing is preferable. In particular, a chemically amplified resist material is preferably used.

Generally, the resist film 4 is formed on a surface of the mask blank by a coating method such as spin coating. In view of fine pattern formation, the resist film 4 preferably has a thickness of 100 nm or less. In this disclosure, the resist film 4 can be a thinner film with a thickness of 80 nm or less.

According to the mask blanks 10 and 12 having the above-mentioned configurations according to the embodiments of this disclosure, the mask blanks have the structure in which the light shielding film made of the silicon-based material or the tantalum-based material and the hard mask film made of the chromium-based material are laminated on the transparent substrate in this order. Even in case where the hard mask film is patterned by the dry etching in the high-bias condition using, as a mask, the resist film having a pattern to be formed on the light shielding film and using the mixed gas of the chlorine-based gas and the oxygen gas, it is possible to reduce a side etching amount generated on a pattern side wall of the hard mask film and to reduce LWR (Line Width Roughness). Thus, it is possible to accurately form a fine transfer pattern on the hard mask film. Furthermore, by patterning the light shielding film using, as a mask, the hard mask film provided with the transfer pattern, it is possible to accurately form a fine pattern on the light shielding film.

This disclosure also provides a method for manufacturing a transfer mask prepared from the above-mentioned mask blank according to this disclosure.

FIGS. 3A-3E are schematic sectional views for illustrating a manufacturing process of the transfer mask using the mask blank according to this disclosure. Herein, description will be made using the above-mentioned mask blank 12, illustrated in FIG. 2, according to the embodiment having the resist film.

Figure 3A:
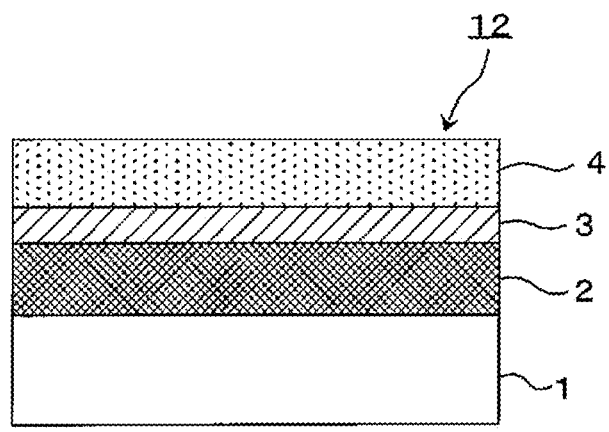
FIGS. 3A-3E are schematic sectional views for illustrating a manufacturing process of a transfer mask using the mask blank according to this disclosure.

On the surface of the mask blank 12, the resist film 4 for electron beam writing is formed to a predetermined thickness (see FIG. 3A).

Figure 3B:
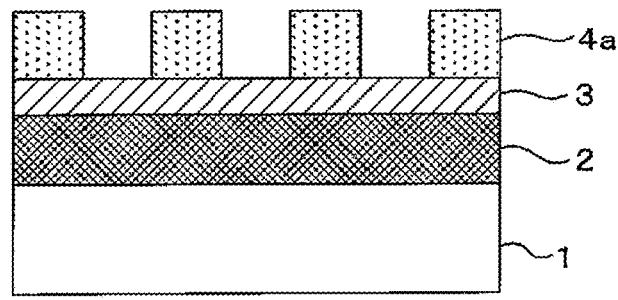

At first, a predetermined pattern is written on the resist film 4 by electron beam writing and, after writing, developed to thereby form a predetermined resist pattern 4a (see FIG. 3B). The resist pattern 4a has a desired device pattern to be formed on the light shielding film 2 as a final transfer pattern.

Figure 3C:
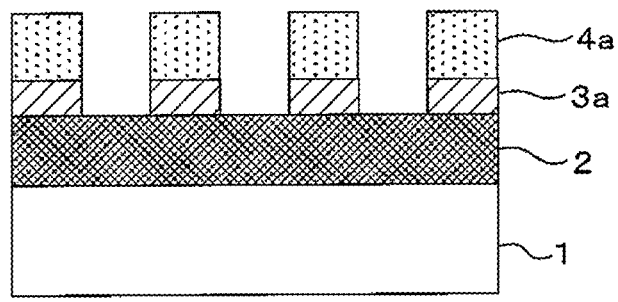

Next, by dry etching using a mixed gas of a chlorine-based gas and an oxygen gas and using, as a mask, the resist pattern 4a formed on the hard mask film 3 of the mask blank, a hard mask film pattern 3a is formed on the hard mask film 3 (see FIG. 3C). In this disclosure, it is preferable to apply the above-mentioned dry etching in the high-bias condition in this case.

By using the mask blank of this disclosure, it is possible to reduce the side etching amount generated on a pattern side wall of the hard mask film 3 when the hard mask film 3 is patterned by dry etching, and to reduce LWR also. Accordingly, a fine pattern can accurately be formed on the hard mask film 3. Thus, the fine transfer pattern of the resist pattern 4a is accurately transferred to the hard mask film 3.

Figure 3D:
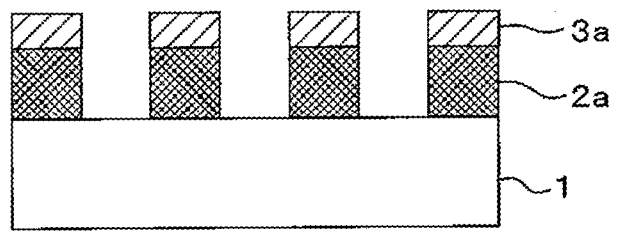

Next, after removing the remaining resist pattern 4a, a light shielding film pattern 2a is formed on the light shielding film 2 by dry etching using a fluorine-based gas and using, as a mask, the pattern 3a formed on the hard mask film 3 (see FIG. 3D).

By patterning the light shielding film 2 using, as a mask, the hard mask film with the fine pattern 3a accurately formed thereon, it is possible to accurately form the fine pattern on the light shielding film 2 also.

Figure 3E:
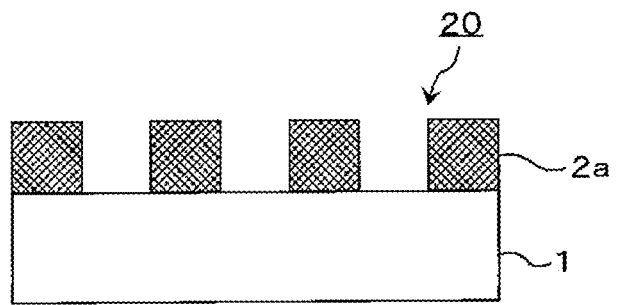

Finally, by removing the hard mask film pattern 3a exposed on a surface by dry etching using a mixed gas of a chlorine-based gas and an oxygen gas (in this case, the dry etching in the normal condition is preferably used), a transfer mask (binary mask) 20 comprising, on the transparent substrate 1, the fine pattern 2a of the light shielding film to serve as a transfer pattern is completed (see FIG. 3E).

By using the mask blank of this disclosure as described above, it is possible to manufacture the transfer mask 20 provided with a high-accuracy fine transfer pattern.

According to a method for manufacturing a semiconductor device, having a step of exposure-transferring, using the transfer mask 20 manufactured using the mask blank of this disclosure, the transfer pattern of the transfer mask onto a resist film on a semiconductor substrate by lithography, it is possible to manufacture a high-quality semiconductor device provided with a device pattern excellent in pattern accuracy.

In the foregoing, description has been made about the method for manufacturing a binary mask from the above-mentioned mask blank 12. However, it is also possible to manufacture a phase shift mask of an eroded Levenson type from the mask blank 12.

On the other hand, the hard mask film 3 of the mask blank in this disclosure is also applicable to a mask blank in another embodiment for manufacturing a reflective mask for EUV lithography with extreme ultra violet (hereinafter called EUV) light as an exposure light source. Specifically, the mask blank of another embodiment has a structure in which a multilayer reflective film, an absorber film, and a hard mask film are laminated on a substrate in this order. The absorber film is made of a material containing tantalum. The hard mask film is a single layer film having a composition gradient portion increased in oxygen content and formed on a surface of the hard mask film that faces away from the absorber film and in a region adjacent thereto. The hard mask film is made of a material containing chromium, oxygen, and carbon. A part of the hard mask film excluding the composition gradient portion has a chromium content of 50 atomic % or more. The hard mask film has a maximum peak of N1s narrow spectrum, obtained by analysis of X-ray photoelectron spectroscopy, which is not higher than a detection lower limit. The part of the hard mask film excluding the composition gradient portion has a maximum peak of Cr2p narrow spectrum, obtained by analysis of X-ray photoelectron spectroscopy, at a binding energy of 574 eV or less. It is noted here that the EUV light refers to light in a wavelength band of a soft X-ray region or a vacuum ultraviolet region and, specifically, light having a wavelength of about 0.2 to 100 nm.

The structure of the hard mask film in the mask blank of another embodiment is similar to that of the above-mentioned hard mask film 3 of this disclosure. The absorber film is made of a material containing tantalum and is similar to the case of the material containing tantalum in the above-mentioned light shielding film 2 in this disclosure. As the substrate, a material such as synthetic quartz glass, quartz glass, aluminosilicate glass, soda lime glass, low-thermal-expansion glass ($SiO_2$—$TiO_2$ glass, or the like), crystallized glass with β-quartz solid solution precipitated therein, single crystal silicon, SiC, and so on may be used.

The multilayer reflective film is a multilayer film formed by laminating a plurality of periods of laminates where one period is a laminate of a low refractive index layer made of a low refractive index material having a low refractive index with respect to the EUV light and a high refractive index layer made of a high refractive index layer having a high refractive index with respect to the EUV light. Generally, the low refractive index layer is formed by a light element or a compound thereof while the high refractive index layer is formed by a heavy element or a compound thereof. The number of periods of the multilayer reflective film is preferably 20 to 60 periods, more preferably 30 to 50 periods. When the EUV light having a wavelength of 13 to 14 nm is used as the exposure light, a multilayer film formed by alternatively laminating a Mo layer and a Si layer in 20 to 60 periods is preferably used. Besides, the multilayer reflective film applicable to the EUV light includes a Si/Ru periodic multilayer film, a Be/Mo periodic multilayer film, an Si compound/Mo compound periodic multilayer film, an Si/Nb periodic multilayer film, an Si/Mo/Ru periodic multilayer film, an Si/Mo/Ru/Mo periodic multilayer film, an Si/Ru/Mo/Ru periodic multilayer film, and so on. Depending on the wavelength band of the EUV light to be applied, the material and the thickness of each layer may appropriately be selected. The multilayer reflective film is desirably formed by sputtering (DC sputtering, RF sputtering, ion beam sputtering, or the like). In particular, it is desirable to use the ion beam sputtering easy in film thickness control.

For a method for manufacturing a reflective mask from the mask blank of another embodiment, the method for manufacturing a transfer mask in this disclosure is applicable. Specifically, the method for manufacturing a reflective mask using the mask blank of another embodiment comprises a step of forming a transfer pattern on a hard mask film by dry etching using a mixed gas of a chlorine-based gas and an oxygen gas with a resist film having a transfer pattern used as a mask, and a step of forming a transfer pattern on the absorber film by dry etching using, as a mask, a fluorine-based gas with a hard mask film having a transfer pattern.

The hard mask film 3 of the mask blank of this disclosure is applicable to a mask blank for use in manufacturing an imprint mold. Specifically, the mask blank for imprint mold comprises a substrate and a hard mask film formed on a main surface thereof. The hard mask film is a single layer film having a composition gradient portion increased in oxygen content and formed on a surface of the hard mask film that faces away from the substrate and in a region adjacent thereto. The hard mask film is made of a material containing chromium, oxygen, and carbon. A part of the hard mask film excluding the composition gradient portion has a chromium content of 50 atomic % or more. The hard mask film has a maximum peak of N1s narrow spectrum, obtained by analysis of X-ray photoelectron spectroscopy, which is not higher than a detection lower limit. The part of the hard mask film excluding the composition gradient portion has a maximum peak of Cr2p narrow spectrum, obtained by analysis of X-ray photoelectron spectroscopy, at a binding energy of 574 eV or less.

The structure of the hard mask film in the mask blank for imprint mold is similar to that of the above-mentioned hard mask film 3 of this disclosure. The hard mask film serves as a hard mask against dry etching using a fluorine-based gas which is carried out when a mold pattern is formed on a main surface of the substrate (the substrate is eroded). As the substrate in this case, a material such as synthetic quartz glass, quartz glass, aluminosilicate glass, soda lime glass, low-thermal-expansion glass ($SiO_2$—$TiO_2$ glass or the like), crystallized glass with β-quartz solid solution precipitated therein, single crystal silicon, SiC, and so on is applicable. The shape of the main surface of the substrate is not limited but preferably is a rectangular shape.

The substrate may have a seating structure formed on a main surface on the side provided with the hard mask film. In this case, the mold pattern is formed on the seating structure on the main surface. The seating structure is preferably located at the center of the main surface. For example, the seating structure has a rectangular shape in plan view (as seen on the side of the main surface). The substrate may be provided with a recessed portion formed on another main surface opposite to the main surface provided with the hard mask film. Preferably, the recessed portion in plan view has a size sufficient to contain a region where the mold pattern is to be formed. For example, the recessed portion has a circular shape in plan view. The shape of the substrate in plan view, the shape of the seating structure, and the shape of the recessed portion are appropriately determined depending on intended use of the imprint mold manufactured from the substrate and are not limited to the above-mentioned structures.

As a method for manufacturing an imprint mold from the mask blank for imprint mold, the method for manufacturing a transfer mask of this disclosure is applicable. Specifically, the method for manufacturing an imprint mold using the mask blank for imprint mold comprises a step of forming, using a resist film having a mold pattern as a mask, a mold pattern on a hard mask film by dry etching using a mixed gas of a chlorine-based gas and an oxygen gas, and a step of forming a mold pattern on a surface of a substrate by dry etching using a fluorine-based gas and using, as a mask, a hard mask film provided with the mold pattern.

The imprint mold manufactured from the mask blank may be either a master mold or a replica mold (copy mold). In case where the master mold is manufactured, for example, a resist film for electron beam writing exposure is applied and formed on the hard mask film and the mold pattern is written on the resist film by an electron beam and exposed. Through a development process and so on, the resist film having the mold pattern is formed. In case where the replica mold is manufactured, for example, photo-curing liquid resin or thermosetting liquid resin is dropped onto the hard mask film. While a mold pattern of a master mold is pressed against the liquid resin, ultraviolet irradiation or heating treatment is performed to cure the liquid resin. Thereafter, the master mold is peeled off to form the resist film having the mold pattern.

EXAMPLES

Hereinafter, the embodiments of this disclosure will more specifically be described with reference to examples.

Example 1

Example 1 relates to a mask blank for use in manufacture of a transfer mask (binary mask) using an ArF excimer laser having a wavelength of 193 nm as exposure light, and to manufacture of the transfer mask.

A mask blank 10 used in Example 1 has a structure in which a light shielding film 2 and a hard mask film 3 are laminated on a transparent substrate 1 in this order, as illustrated in FIG. 1. The mask blank 10 was manufactured as follows.

The transparent substrate 1 (having a size of about 152 mm×152 mm×thickness of about 6.35 mm) made of synthetic quartz glass was prepared. In the transparent substrate 1, a main surface and an end face are polished to a predetermined surface roughness (for example, the main surface has Rq of 0.2 nm or less).

Next, the transparent substrate 1 was placed in a single-wafer RF sputtering apparatus. Using a silicon (Si) target and a mixed gas of krypton (Kr), helium (He), and nitrogen ($N_2$) (flow rate ratio Kr:He:$N_2$=10:100:1, pressure=0.1 Pa) as a sputtering gas with a power of an RF power supply set at 1.5 kW, reactive sputtering (RF sputtering) was carried out to form the light shielding film 2 made of silicon and nitrogen (Si:N=50 atomic %:50 atomic %) on the transparent substrate 1 to a thickness of 57 nm. Herein, the composition of the light shielding film 2 is a result obtained by measurement using X-ray photoelectron spectroscopy (XPS) for a light shielding film formed on another transparent substrate in the condition same as that mentioned above.

Next, for the purpose of stress adjustment of the film, the transparent substrate 1 provided with the light shielding film 2 was subjected to heat treatment in the air in a condition of a heating temperature of 500° C. and a processing time of 1 hour. A spectral transmittance of the light shielding film 2 after the heat treatment was measured using a spectrophotometer (Cary 4000 manufactured by Agilent Technologies). As a result, the transmittance of the light shielding film 2 with respect to light of a long wavelength not shorter than 800 nm and not longer than 900 nm monotonously increased as the wavelength become longer. Transmittances at the wavelengths of 800 nm, 850 nm, 890 nm, and 900 nm were equal to 42.8%, 44.9%, 46.7%, and 47.0%, respectively. An optical density (OD value) of the light shielding film 2 with respect to the ArF excimer laser light (wavelength: 193 nm) was equal to 2.96.

Furthermore, by using a spectroscopic ellipsometer (M-2000D manufactured by J. A. Woollam Co. Ltd.), a refractive index n and an extinction coefficient k of the light shielding film 2 were measured. As a result, the light shielding film 2 had the refractive index n of 1.830 and the extinction coefficient of 1.785 at the wavelength of 193 nm, the refractive index n of 3.172 and the extinction coefficient k of 0.093 at the wavelength of 800 nm, the refractive index n of 3.137 and the extinction coefficient k of 0.066 at the wavelength of 850 nm, the refractive index n of 3.112 and the extinction coefficient of 0.050 at the wavelength of 890 nm, and the refractive index n of 3.106 and the extinction coefficient k of 0.047 at the wavelength of 900 nm. Furthermore, by using a spectrophotometer (U-4100 manufactured by Hitachi High-Technologies), a front surface reflectance and a rear surface reflectance of the light shielding film 2 at the wavelength of 193 nm were measured and were equal to 37.1% and 30.0%, respectively.

Next, the transparent substrate 1 provided with the light shielding film 2 was placed in the single wafer DC sputtering apparatus. By reactive sputtering using a target of chromium in a mixed gas atmosphere of argon (Ar), carbon dioxide ($CO_2$), and helium (He), the hard mask film 3 comprising a CrOC film containing chromium, oxygen, and carbon was formed on the light shielding film 2 to the thickness of 9 nm.

In the above-mentioned manner, the mask blank 10 according to Example 1 was manufactured.

Only the hard mask film 3 of Example 1 was formed on another transparent substrate 1 and the hard mask film 3 was analyzed by X-ray photoelectron spectroscopy (with RBS (Rutherford Backscattering Spectroscopy) correction). As a result, it was confirmed that the hard mask film 3 had a composition gradient portion (having an oxygen content of 40 atomic % or more) which was formed in a region adjacent to a surface of the hard mask film that faces away from the light shielding film 2 (a region from the surface to a depth of about 2 nm) and which had an oxygen content greater than that in the other region. It was also confirmed that, in the region of the hard mask film 3 excluding the composition gradient portion, the contents of the respective constituent elements were Cr: 71 atomic %, O: 15 atomic %, and C: 14 atomic % in average. Furthermore, it was confirmed that, in the region of the hard mask film 3 excluding the composition gradient portion, a difference in content of each constituent element in the thickness direction was 3 atomic % or less and there was no substantial composition gradient in the thickness direction.

Figure 4:
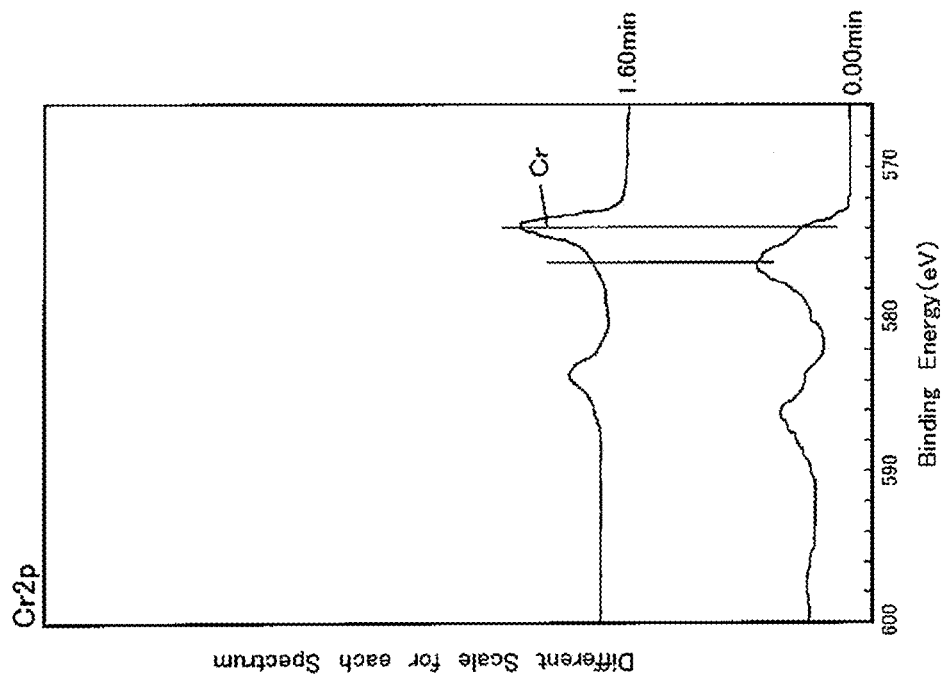
FIG. 4 is a view for illustrating a Cr2p narrow spectrum obtained by analyzing a hard mask film of a mask blank of Example 1 of this disclosure by X-ray photoelectron spectroscopy (XPS)
Figure 5:
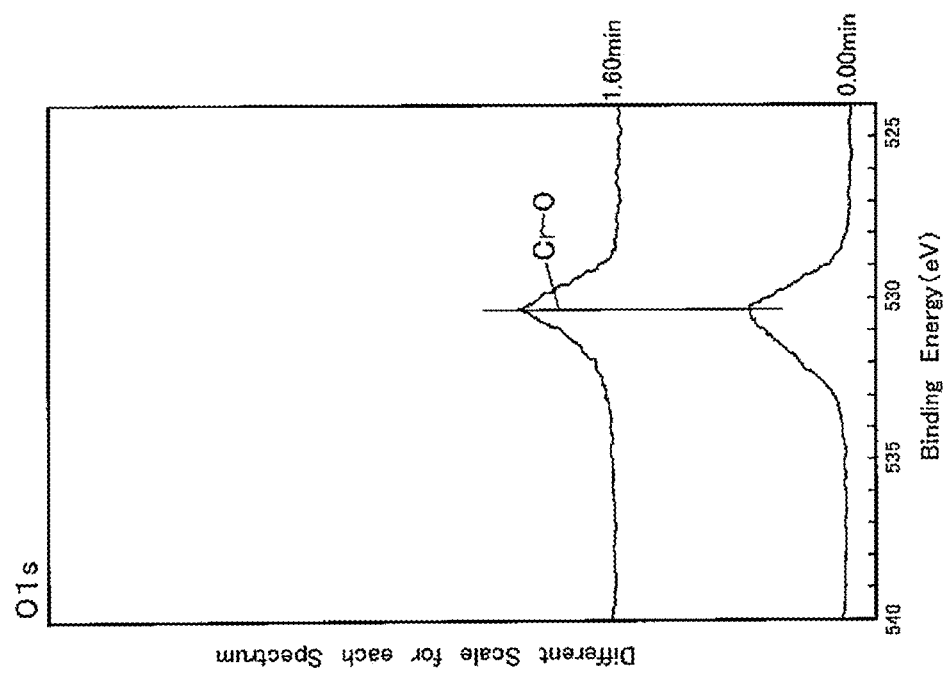
FIG. 5 is a view for illustrating an O1s narrow spectrum obtained by analyzing the hard mask film of the mask blank of Example 1 of this disclosure by X-ray photoelectron spectroscopy (XPS)
Figure 6:
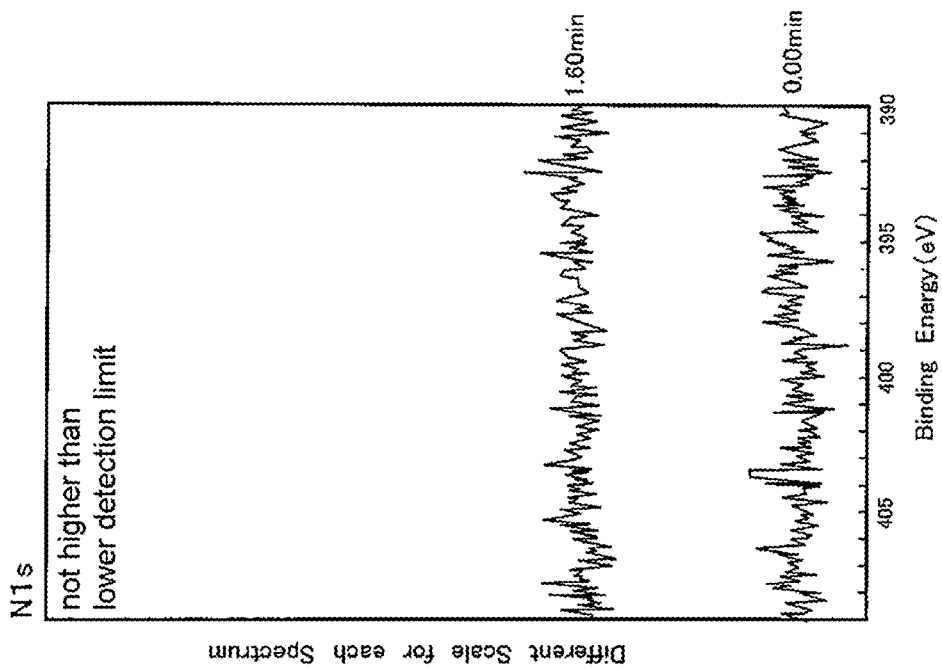
FIG. 6 is a view for illustrating an N1s narrow spectrum obtained by analyzing the hard mask film of the mask blank of Example 1 of this disclosure by X-ray photoelectron spectroscopy (XPS)
Figure 7:
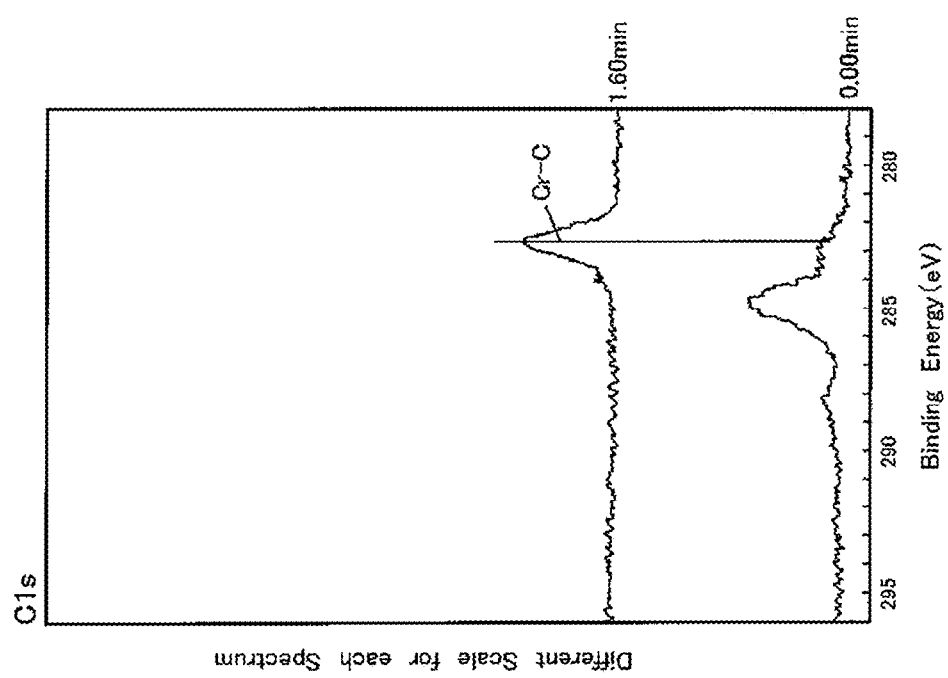
FIG. 7 is a view for illustrating a C1s narrow spectrum obtained by analyzing the hard mask film of the mask blank of Example 1 of this disclosure by X-ray photoelectron spectroscopy (XPS)
Figure 8:
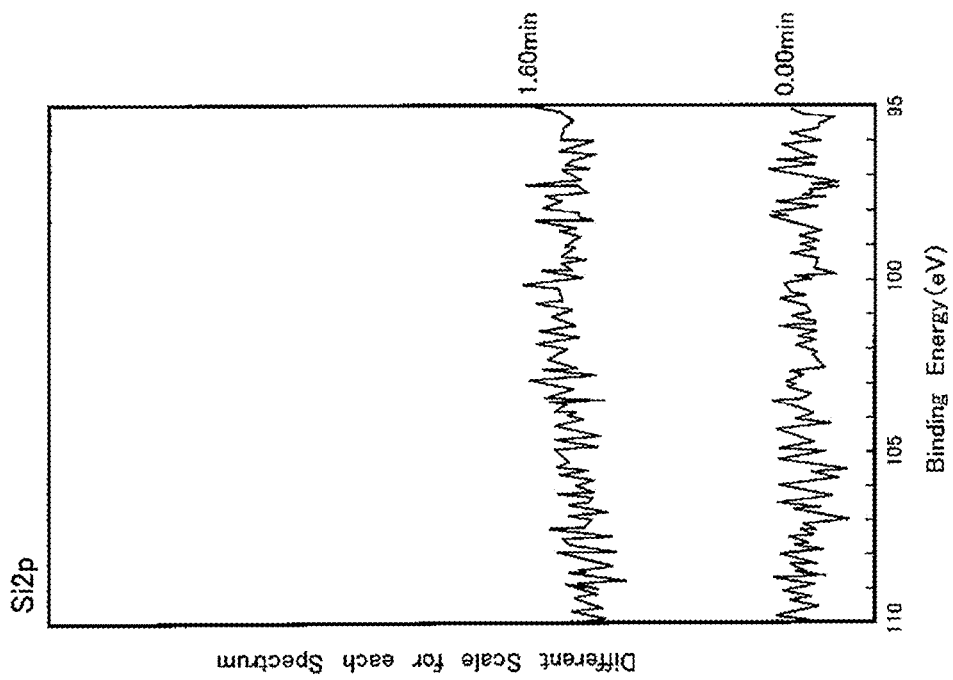
FIG. 8 is a view for illustrating an Si2p narrow spectrum obtained by analyzing the hard mask film of the mask blank of Example 1 of this disclosure by X-ray photoelectron spectroscopy (XPS)

FIG. 4 shows a result of depth direction chemical bonding state analysis of Cr2p narrow spectrum, obtained by analysis on the hard mask film 3 of Example 1 formed on another transparent substrate 1 by X-ray photoelectron spectroscopy. FIG. 5 shows a result of depth direction chemical bonding state analysis of O1s narrow spectrum. FIG. 6 shows a result of depth direction chemical bonding state analysis of N1s narrow spectrum. FIG. 7 shows a result of depth direction chemical bonding state analysis of C1s narrow spectrum. FIG. 8 shows a result of depth direction chemical bonding state analysis of Si2p narrow spectrum.

In the analysis on the hard mask film 3 by X-ray photo-electron spectroscopy, the hard mask film 3 is analyzed in the film thickness direction by repeating the steps of at first radiating X-ray towards the surface of the hard mask film 3 to measure energy distribution of photoelectrons emitted from the hard mask film 3, then eroding the hard mask film 3 by Ar gas sputtering for a predetermined time duration, and radiating X-ray to the surface of the hard mask film 3 in an eroded region to measure energy distribution of photoelectrons emitted from the hard mask film 3. In Example 1, the analysis of X-ray photoelectron spectroscopy was carried out using monochromatized Al (1486.6 eV) as an X-ray source in a condition that a photoelectron detection area was 100 μmϕ and a detection depth was about 4 to 5 nm (takeoff angle: 45 deg) (the same applies to examples and comparative examples hereinafter).

In each depth direction chemical bonding state analysis in FIGS. 4 to 8, a plot "0.00 min" in each figure shows an analysis result of an uppermost surface of the hard mask film 3 before the Ar gas sputtering (sputtering time: 0 min). A plot "1.60 min" in each figure shows an analysis result at a position in the film thickness direction of the hard mask film 3 after eroding the hard mask film 3 from the uppermost surface for 1.60 min by Ar gas sputtering.

The position in the film thickness direction of the hard mask film 3 after eroding the hard mask film 3 from the uppermost surface for 1.60 min by Ar gas sputtering is a position deeper than the above-mentioned composition gradient portion. Thus, the plot "1.60 min" is a measurement result in the part of the hard mask film 3 excluding the composition gradient portion.

In the narrow spectra in FIGS. 4 to 8, scales on the vertical axis are not same. In N1s narrow spectrum in FIG. 6 and Si2p narrow spectrum in FIG. 8, the scales on the vertical axis are enlarged as compared with the narrow spectra in FIGS. 4, 5, and 7. Therefore, a wave of vibration in each of N1s narrow spectrum in FIG. 6 and Si2p narrow spectrum in FIG. 8 does not represent presence of a peak but represents noise.

From the analysis result of Cr2p narrow spectrum in FIG. 4, it is understood that the hard mask film 3 in Example 1 has a maximum peak at a binding energy of 574 eV in the region excluding the composition gradient portion. The above-mentioned result means that chromium atoms which are not bonded to atoms such as oxygen exist in the hard mask film 3 at a predetermined ratio or more.

From the analysis result of O1s narrow spectrum in FIG. 5, it is understood that the hard mask film 3 in Example 1 has a maximum peak at a binding energy of about 530 eV in the region excluding the composition gradient portion. The above-mentioned result means that Cr—O bond exists in the hard mask film 3 at a predetermined ratio or more.

From the analysis result of N1s narrow spectrum in FIG. 6, it is understood that the hard mask film 3 in Example 1 has a maximum peak of the binding energy which is not higher than a detection lower limit in all regions in the thickness direction. The above-mentioned result means that atoms bonded to nitrogen, including Cr—N bond, were not detected in the hard mask film 3.

From the analysis result of C1s narrow spectrum in FIG. 7, it is understood that the hard mask film 3 in Example 1 has a maximum peak at a binding energy of 282 eV to 283 eV in the region excluding the composition gradient portion. The above-mentioned result means that Cr—C bond exists in the hard mask film 3 at a predetermined ratio or more.

From the analysis result of Si2p narrow spectrum in FIG. 8, it is understood that, in the hard mask film 3 in Example 1, the maximum peak of the binding energy is not higher than the detection lower limit in all regions in the thickness direction. The above-mentioned result means that atoms bonded to silicon, including Cr—Si bond, were not detected in the hard mask film 3.

Next, using the mask blank 10, a transfer mask (binary mask) was manufactured according to the above-mentioned manufacturing process illustrated in FIGS. 3A-3E. The following reference numerals correspond to those in FIGS. 3A-3E.

At first, a chemically amplified resist for electron beam writing (PRL009 manufactured by Fuji Film Electronics Materials Co. Ltd.) was applied onto an upper surface of the above-mentioned mask blank 10 by spin coating and subjected to predetermined baking to form a resist film 4 having a thickness of 80 nm (see FIG. 3A).

Next, using an electron beam writing apparatus, a predetermined device pattern (pattern corresponding to a transfer pattern to be formed on the light shielding film 2) was written on the resist film 4 and, thereafter, the resist film was developed to form a resist pattern 4a (see FIG. 3B). The resist pattern 4a includes a line-and-space pattern having a line width of 100 nm.

Next, with the resist pattern 4a used as a mask, the hard mask film 3 was dry etched by the above-mentioned dry etching in the high-bias condition to form a pattern 3a on the hard mask film 3 (see FIG. 3C). The dry etching was carried out using, as a dry etching gas, a mixed gas of a chlorine gas ($Cl_2$) and an oxygen gas ($O_2$) ($Cl_2$:$O_2$=13:1 (flow rate ratio)) with a high bias such that the power upon application of a bias voltage was 50 W.

Next, after the above-mentioned resist pattern 4a was removed, the light shielding film 2 comprising an SiN film was dry etched with the pattern 3a of the hard mask film used as a mask to form a pattern 2a on the light shielding film 2 (see FIG. 3D). As a dry etching gas, a fluorine-based gas ($CF_4$) was used.

Finally, the pattern 3a of the hard mask film was removed by the above-mentioned dry etching in the normal condition to complete a binary transfer mask 20 having the light shielding film pattern 2a on the transparent substrate 1 (see FIG. 3E). Herein, dry etching was carried out using a mixed gas of a chlorine gas ($Cl_2$) and an oxygen gas ($O_2$) ($Cl_2$:$O_2$: 4:1 (flow rate ratio)) as a dry etching gas with a low bias such that the power upon application of a bias voltage was 5 W.

In the above-mentioned manufacturing process of the transfer mask, for each of the resist pattern 4a, the hard mask film pattern 3a, and the light shielding film pattern 2a, the line width was measured by a critical dimension scanning electron microscope (CD-SEM) in the region where the line-and-space pattern was formed.

At each of a plurality of positions in the same region where the line-and-space pattern was formed, an etching bias was calculated which was a variation amount between the line width of the resist pattern 4a and the line width of the hard mask film pattern 3a and, furthermore, an average value of etching bias was calculated. As a result, the average value of etching bias was about 6 nm which was significantly smaller than that in case of dry etching on a conventional chromium-based material film. LWR (Line Width Roughness) of the hard mask film pattern 3a was about 6 nm which was a considerably small value.

This shows that, also in case where the hard mask film 3 is patterned by the dry etching in the high-bias condition using the resist pattern 4a as a mask and using a mixed gas of a chlorine-based gas and an oxygen gas, it is possible to reduce the side etching amount generated on the pattern side wall of the hard mask film 3 and to reduce LWR. Therefore, a fine pattern can accurately be formed on the hard mask film 3. Therefore, the fine transfer pattern of the resist pattern 4a is accurately transferred to the hard mask film 3.

At a plurality of positions in the same region where the line-and-space pattern is formed, an average value of etching bias between the line width of the hard mask film pattern 3a and the line width of the light shielding film pattern 2a was calculated. As a result, the average value was about 5 nm which was a very small value. Thus, when the light shielding film 2 is patterned by dry etching using the fluorine-based gas and using, as a mask, the hard mask film with the fine pattern 3a accurately formed thereon, a fine pattern can accurately be formed on the light shielding film 2 also.

The above-mentioned transfer mask 20 thus obtained was subjected to inspection of the mask pattern by a mask inspection apparatus. As a result, it was confirmed that the fine pattern was formed in an allowable range from a designed value.

As described above, by using the mask blank of Example 1, it is possible to manufacture the transfer mask 20 provided with a high-accuracy fine transfer pattern.

Furthermore, by using AIMS193 (manufactured by Carl Zeiss), the transfer mask 20 was subjected to simulation of an exposure transfer image when exposure transfer was carried out onto a resist film on a semiconductor device using exposure light having a wavelength of 193 nm. When the exposure transfer image obtained by the simulation was verified, a design specification was sufficiently satisfied. From the above, it is said that, when the transfer mask 20 manufactured from the mask blank of Example 1 is set in the exposure apparatus and is subjected to exposure transfer by the exposure light of the ArF excimer laser, exposure transfer can be carried out with high accuracy onto the resist film on the semiconductor device.

Example 2

A mask blank 10 in Example 2 was prepared in the manner similar to Example 1 except a hard mask film 3. The hard mask film 3 in Example 2 was formed in a film forming condition changed from that of the hard mask film 3 in Example 1 as follows.

Specifically, a synthetic quartz substrate provided with the light shielding film 2 comprising the SiN film in Example 1 was placed in a single-wafer DC sputtering apparatus. Using a target comprising chromium, reactive sputtering was carried out in a mixed gas atmosphere of Argon (Ar), carbon dioxide ($CO_2$), and helium (He) so that the hard mask film 3 comprising a CrOC film containing chromium, oxygen, and carbon was formed on the light shielding film 2 to the thickness of 9 nm.

In the above-mentioned manner, the mask blank 10 of Example 2 was prepared.

Only the hard mask film 3 in Example 2 was formed on another transparent substrate 1 and the hard mask film 3 was analyzed by X-ray photoelectron spectroscopy (with RBS correction). As a result, it was confirmed that the hard mask film 3 had a composition gradient portion (having an oxygen content of 40 atomic % or more) which was formed in the region near a surface of the hard mask film 3 that faces away from the light shielding film 2 (the region from the surface to the depth of 2 nm) and which had an oxygen content greater than that in the other region. It was also confirmed that, in the region of the hard mask film 3 excluding the composition gradient portion, the contents of the respective constituent elements were Cr: 55 atomic %, O: 30 atomic %, and C: 15 atomic % in average. Furthermore, it was confirmed that, in the region of the hard mask film 3 excluding the composition gradient portion, a difference in content of each constituent element in the thickness direction was 3 atomic % or less and there was no substantial composition gradient in the thickness direction.

Figure 9:
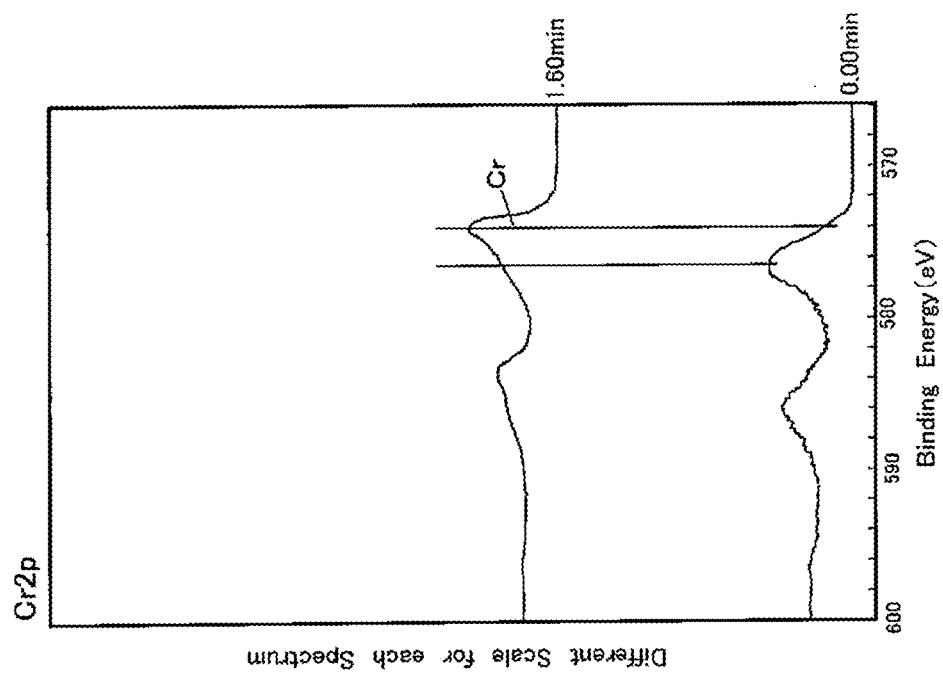
FIG. 9 is a view for illustrating a Cr2p narrow spectrum obtained by analyzing a hard mask film of a mask blank of Example 2 of this disclosure by X-ray photoelectron spectroscopy (XPS)
Figure 10:
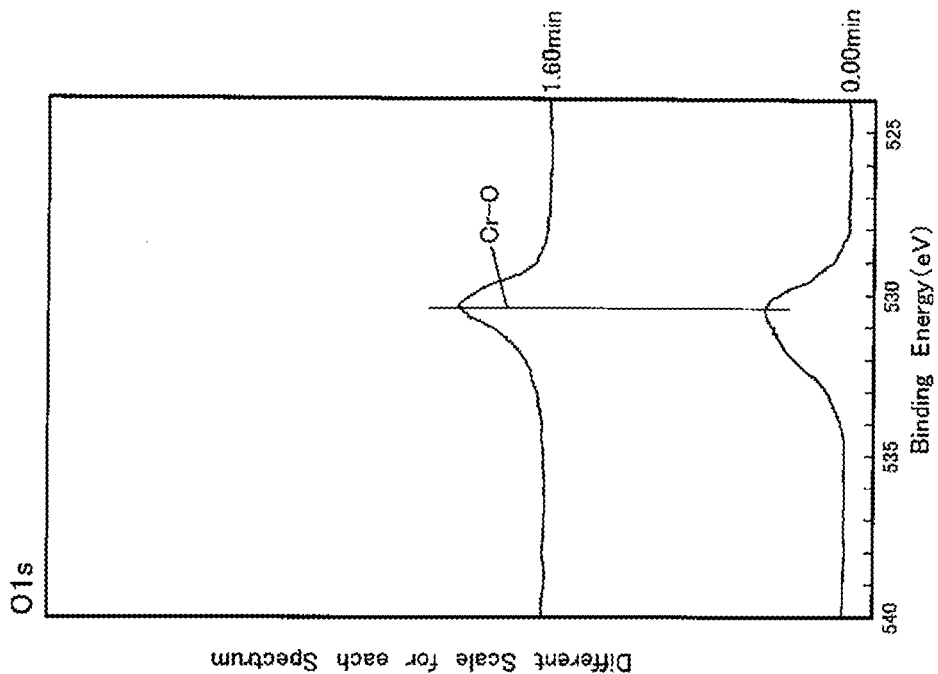
FIG. 10 is a view for illustrating an O1s narrow spectrum obtained by analyzing the hard mask film of the mask blank of Example 2 of this disclosure by X-ray photoelectron spectroscopy (XPS)
Figure 11:
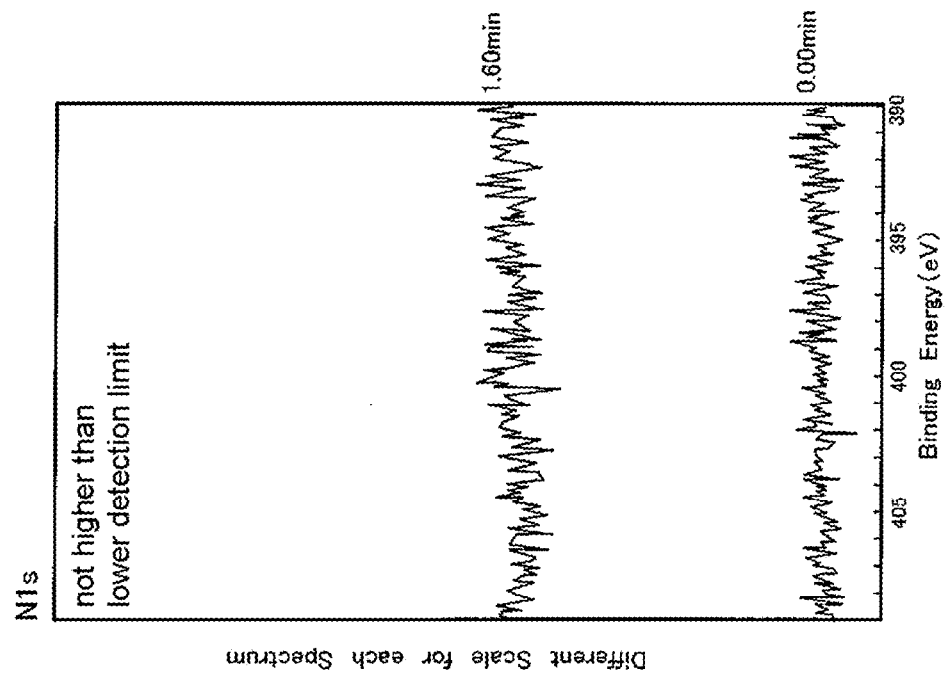
FIG. 11 is a view for illustrating an N1s narrow spectrum obtained by analyzing the hard mask film of the mask blank of Example 2 of this disclosure by X-ray photoelectron spectroscopy (XPS)
Figures 12, 13:
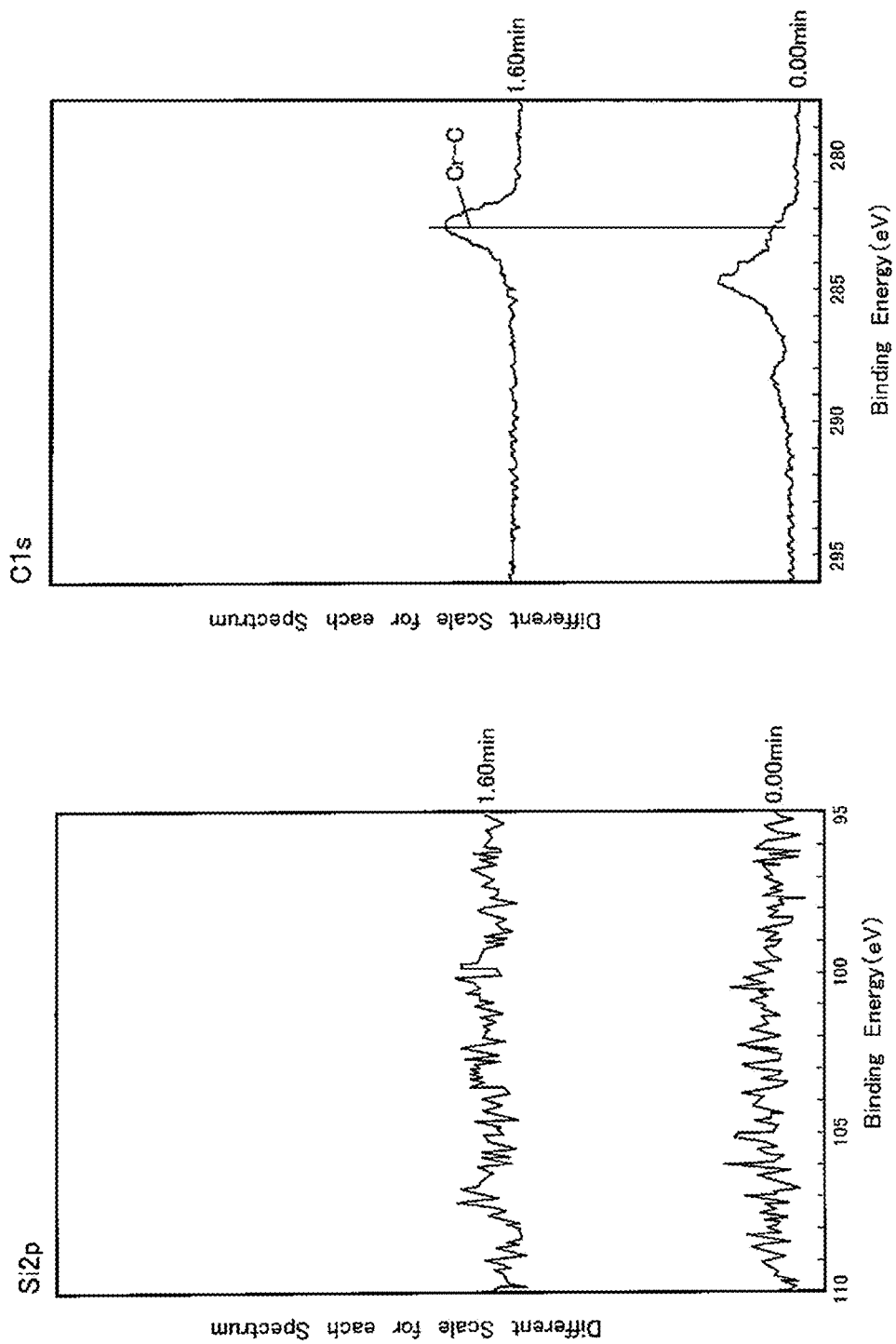
FIG. 12 is a view for illustrating a C1s narrow spectrum obtained by analyzing the hard mask film of the mask blank of Example 2 of this disclosure by X-ray photoelectron spectroscopy (XPS)
FIG. 13 is a view for illustrating an Si2p narrow spectrum obtained by analyzing the hard mask film of the mask blank of Example 2 of this disclosure by X-ray photoelectron spectroscopy (XPS)

In the manner similar to Example 1, FIG. 9 shows a result of depth direction chemical bonding state analysis of Cr2p narrow spectrum, obtained by analysis on the hard mask film 3 of Example 2 formed on another transparent substrate 1 by X-ray photoelectron spectroscopy. FIG. 10 shows a result of depth direction chemical bonding state analysis of O1s narrow spectrum. FIG. 11 shows a result of depth direction chemical bonding state analysis of N1s narrow spectrum. FIG. 12 shows a result of depth direction chemical bonding state analysis of C1s narrow spectrum. FIG. 13 shows a result of depth direction chemical bonding state analysis of Si2p narrow spectrum.

In each depth direction chemical bonding state analysis in FIGS. 9 to 13, a plot "0.00 min" in each figure shows an analysis result of an uppermost surface of the hard mask film 3 before the Ar gas sputtering (sputtering time: 0 min). A plot "1.60 min" in each figure shows an analysis result at a position in the film thickness direction of the hard mask film 3 after eroding the hard mask film 3 from the uppermost surface for 1.60 min by Ar gas sputtering.

The position in the hard mask film 3 in the film thickness direction after eroding the hard mask film 3 from the uppermost surface for 1.60 min by Ar gas sputtering is a position deeper than the above-mentioned composition gradient portion. Thus, the plot "1.60 min" is a measurement result in the part of the hard mask film 3 excluding the composition gradient portion.

In the narrow spectra in FIGS. 9 to 13, scales on the vertical axis are not same. In N1s narrow spectrum in FIG. 11 and the Si2p narrow spectrum in FIG. 13, the scales on the vertical axis are enlarged as compared with the narrow spectra in FIGS. 9, 10, and 12. Therefore, a wave of vibration in each of N1s narrow spectrum in FIG. 11 and Si2p narrow spectrum in FIG. 13 does not represent presence of a peak but represents noise.

From the analysis result of Cr2p narrow spectrum in FIG. 9, it is understood that the hard mask film 3 in Example 2 has a maximum peak at a binding energy of 574 eV in the region excluding the composition gradient portion. The above-mentioned result means that chromium atoms which are not bonded to atoms such as oxygen exist in the hard mask film 3 at a predetermined ratio or more.

From the analysis result of O1s narrow spectrum in FIG. 10, it is understood that the hard mask film 3 in Example 2 has a maximum peak at a binding energy of about 530 eV in the region excluding the composition gradient portion. The above-mentioned result means that Cr—O bond exists in the hard mask film 3 at a predetermined ratio or more.

From the analysis result of N1s narrow spectrum in FIG. 11, it is understood that the hard mask film 3 in Example 2 has a maximum peak of the binding energy which is not higher than a detection lower limit in all regions in the thickness direction. The above-mentioned result means that atoms bonded to nitrogen, including Cr—N bond, were not detected in the hard mask film 3.

From the analysis result of C1s narrow spectrum in FIG. 12, it is understood that the hard mask film 3 in Example 2 has a maximum peak at a binding energy of 282 eV to 283 eV in the region excluding the composition gradient portion. The above-mentioned result means that Cr—C bond exists in the hard mask film 3 at a predetermined amount or more.

From the analysis result of Si2p narrow spectrum in FIG. 13, it is understood that, in the hard mask film 3 in Example 2, the maximum peak of the binding energy is not higher than the detection lower limit in all regions in the thickness direction. The above-mentioned result means that atoms bonded to silicon, including Cr—Si bond, were not detected in the hard mask film 3.

Next, using the mask blank 10 in Example 2, a transfer mask (binary mask) 20 having a light shielding film pattern 2a on the transparent substrate 1 was manufactured according to a manufacturing process similar to that in Example 1 mentioned above.

In the manner similar to Example 1, in the manufacturing process of the transfer mask in Example 2, for each of the resist pattern 4a, the hard mask film pattern 3a, and the light shielding film pattern 2a, the line width was measured by a critical dimension SEM in the region where the line-and-space pattern was formed.

At each of a plurality of positions in the same region where the line-and-space pattern was formed, an etching bias was calculated which was a variation amount between the line width of the resist pattern 4a and the line width of the hard mask film pattern 3a and, furthermore, an average value of etching bias was calculated. As a result, the average value of etching bias was about 10 nm which was significantly smaller than that in case of dry etching on a conventional chromium-based material film. LWR of the hard mask film pattern 3a was about 6.5 nm which was a considerably small value.

This shows that, also in case where the hard mask film 3 is patterned by the dry etching in the high-bias condition using the resist pattern 4a as a mask and using a mixed gas of a chlorine-based gas and an oxygen gas, it is possible to reduce the side etching amount generated on the pattern side wall of the hard mask film 3 and to reduce LWR. Therefore, a fine pattern can accurately be formed on the hard mask film 3. Thus, the fine transfer pattern of the resist pattern 4a is accurately transferred to the hard mask film 3.

At a plurality of positions in the same region where the line-and-space pattern is formed, an average value of etching bias between the line width of the hard mask film pattern 3a and the line width of the light shielding film pattern 2a was calculated. As a result, the average value was about 5 nm which is a very small value. Thus, when the light shielding film 2 is patterned by dry etching using the fluorine-based gas and using, as a mask, the hard mask film with the fine pattern 3a accurately formed thereon, a fine pattern can accurately be formed on the light shielding film 2 also.

The above-mentioned transfer mask 20 in Example 2 thus obtained was subjected to inspection of the mask pattern by a mask inspection apparatus. As a result, it was confirmed that the fine pattern was formed in an allowable range from a designed value.

As described above, by using the mask blank of Example 2, it is possible to manufacture the transfer mask 20 provided with a high-accuracy fine transfer pattern.

Furthermore, by using AIMS193 (manufactured by Carl Zeiss), the transfer mask 20 of Example 2 was subjected to simulation of an exposure transfer image when exposure transfer was carried out onto a resist film on a semiconductor device using exposure light having a wavelength of 193 nm, in the manner similar to Example 1. When the exposure transfer image obtained by the simulation was verified, a design specification was sufficiently satisfied. From the above, it is said that, when the transfer mask 20 manufactured from the mask blank of Example 2 is set in the exposure apparatus and is subjected to exposure transfer by exposure light of the ArF excimer laser, exposure transfer can be carried out with high accuracy onto the resist film on the semiconductor device.

Comparative Example 1

A mask blank of Comparative Example 1 was prepared in the manner similar to Example 1 except a hard mask film. The hard mask film in Comparative Example 1 was formed in a film forming condition changed from that of the hard mask film 3 in Example 1 as follows.

Specifically, a synthetic quartz substrate provided with the light shielding film 2 comprising the SiN film in Example 1 was placed in a single-wafer DC sputtering apparatus. Using a target comprising chromium, reactive sputtering was carried out in a mixed gas atmosphere of Argon (Ar), carbon dioxide ($CO_2$), nitrogen ($N_2$), and helium (He) so that the hard mask film comprising a CrOCN film containing chromium, oxygen, carbon, and nitrogen was formed on the light shielding film 2 to the thickness of 9 nm.

In the above-mentioned manner, the mask blank of Comparative Example 1 was prepared.

Next, only the hard mask film in Comparative Example 1 was formed on another transparent substrate 1 and the hard mask film was analyzed by X-ray photoelectron spectroscopy (with RBS correction). As a result, it was confirmed that the hard mask film in Comparative Example 1 had a composition gradient portion (having an oxygen content of 40 atomic % or more) which was formed in a region adjacent to a surface of the hard mask film that faces away from the light shielding film (the region from the surface to the depth of 2 nm) and which had an oxygen content greater than that in the other region. It was also confirmed that, in the region of the hard mask film in Comparative Example 1 excluding the composition gradient portion, the contents of the respective constituent elements were Cr: 55 atomic %, O: 22 atomic %, C: 12 atomic %, and N: 11 atomic % in average. Furthermore, it was confirmed that, in the region of the hard mask film excluding the composition gradient portion, a difference in content of each constituent element in the thickness direction was 3 atomic % or less and there was no substantial composition gradient in the thickness direction.

Figure 14:
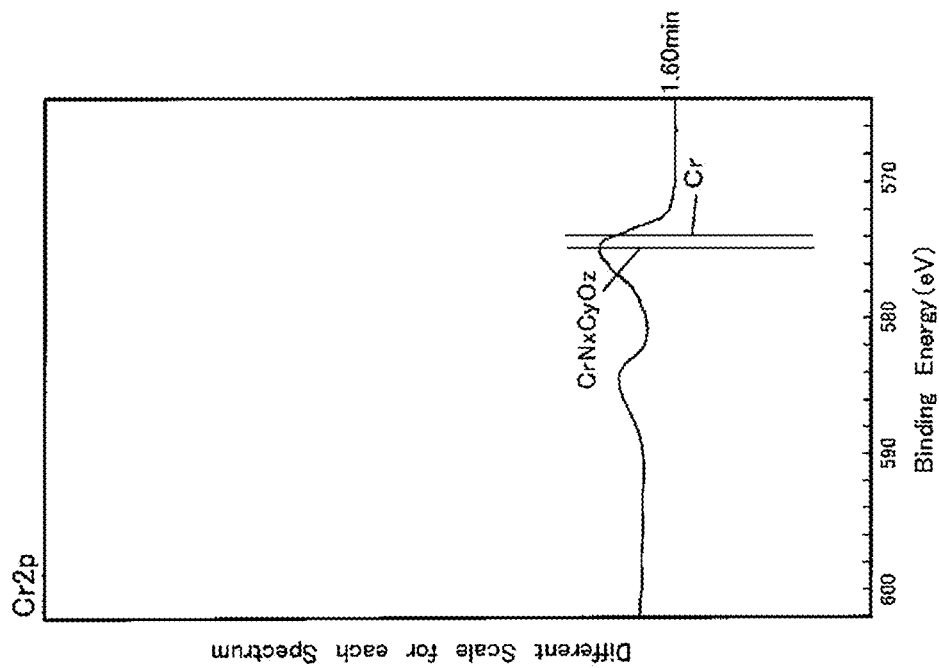
FIG. 14 is a view for illustrating a Cr2p narrow spectrum obtained by analyzing a hard mask film of a mask blank of Comparative Example by X-ray photoelectron spectroscopy (XPS)
Figure 15:
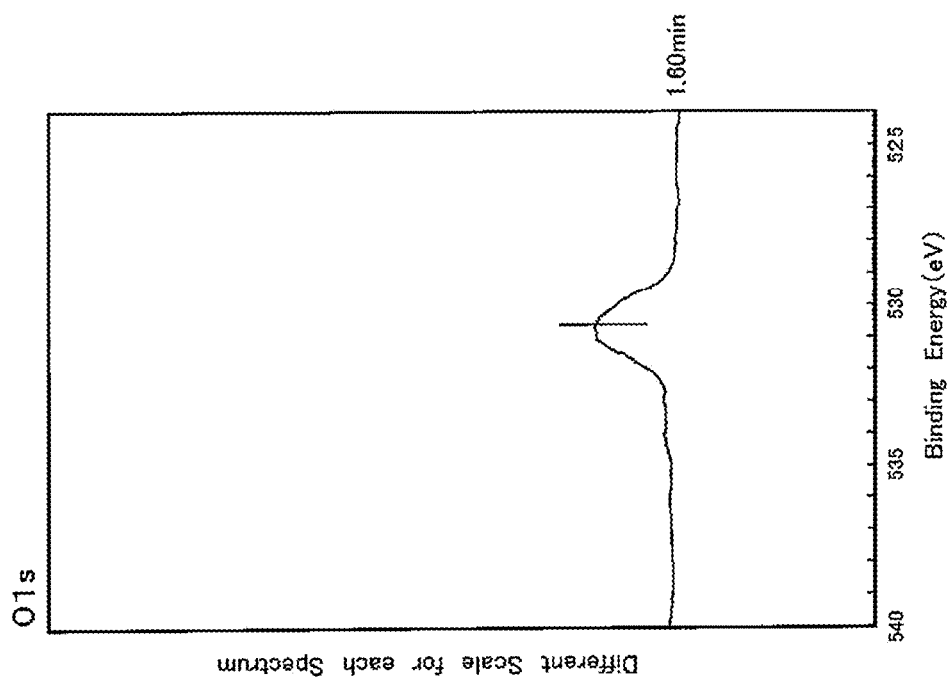
FIG. 15 is a view for illustrating an O1s narrow spectrum obtained by analyzing the hard mask film of the mask blank of Comparative Example by X-ray photoelectron spectroscopy (XPS)
Figure 16:
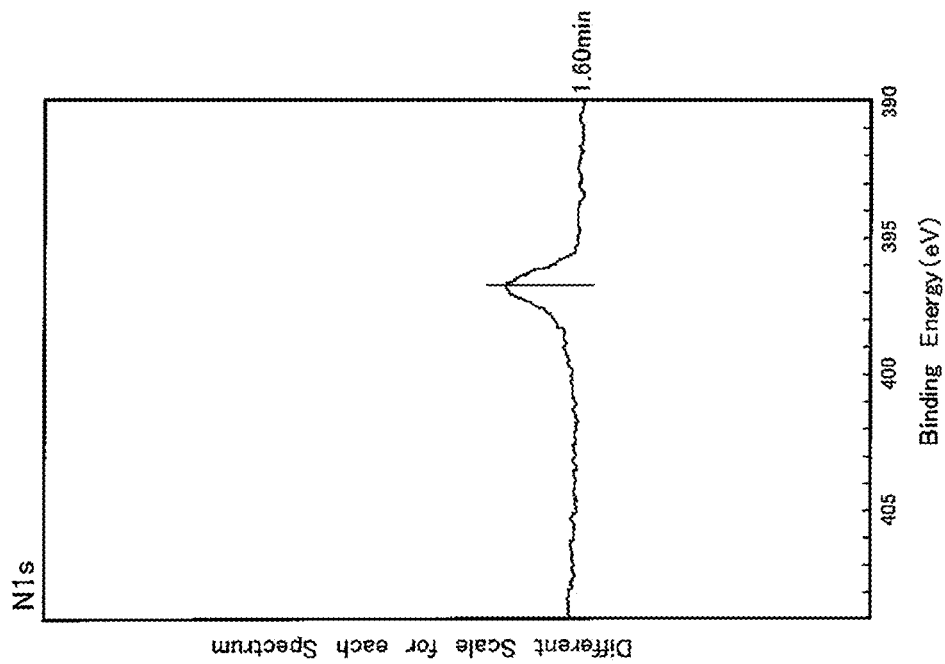
FIG. 16 is a view for illustrating an N1s narrow spectrum obtained by analyzing the hard mask film of the mask blank of Comparative Example by X-ray photoelectron spectroscopy (XPS)
Figure 17:
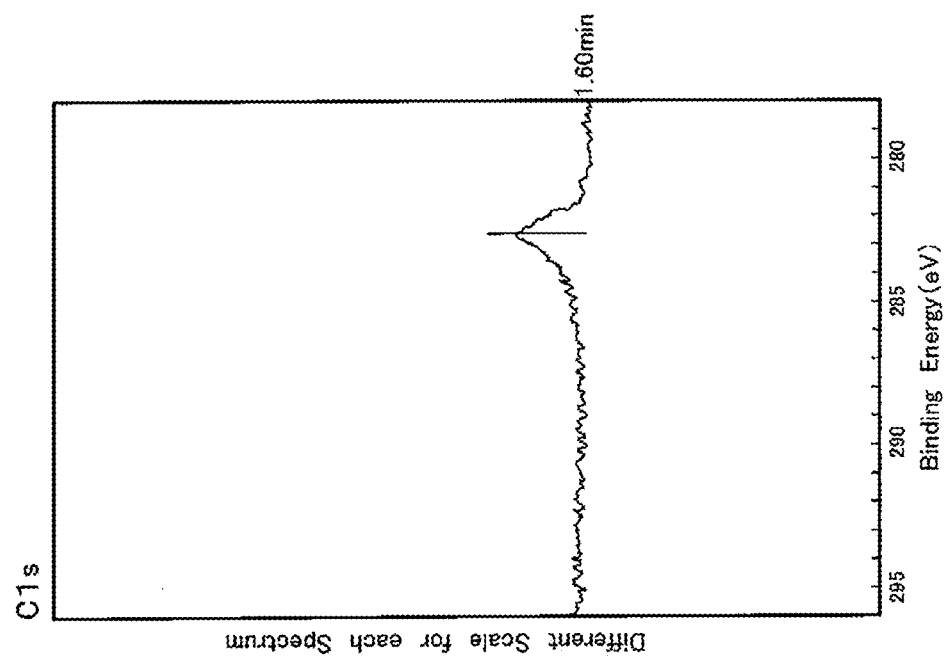
FIG. 17 is a view for illustrating a C1s narrow spectrum obtained by analyzing the hard mask film of the mask blank of Comparative Example by X-ray photoelectron spectroscopy (XPS)
Figure 18:
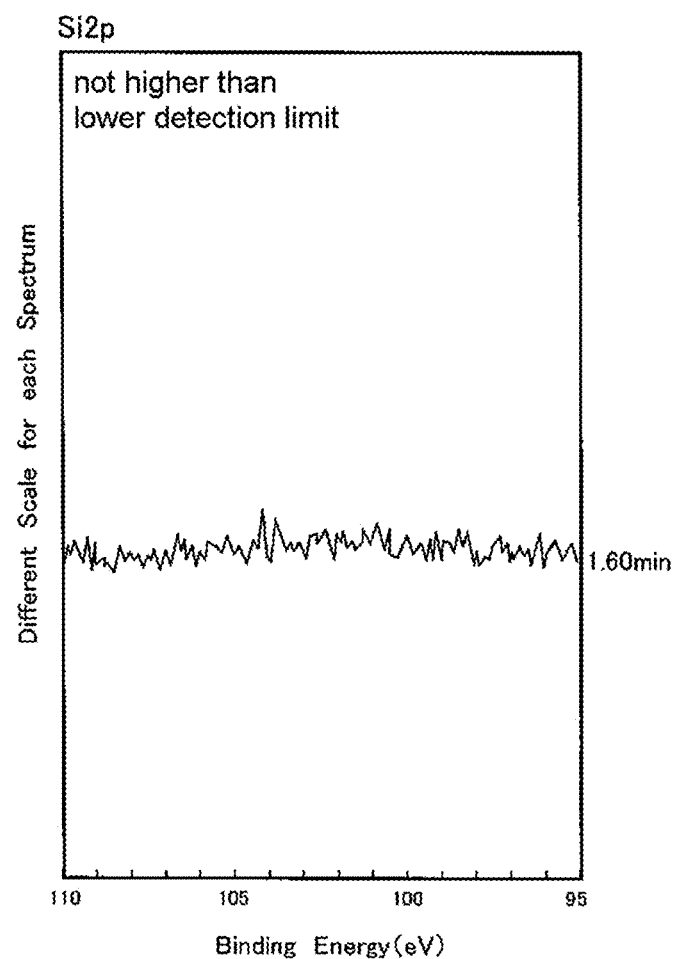
FIG. 18 is a view for illustrating an Si2p narrow spectrum obtained by analyzing the hard mask film of the mask blank of Comparative Example by X-ray photoelectron spectroscopy (XPS)

In the manner similar to Example 1, FIG. 14 shows a result of depth direction chemical bonding state analysis of Cr2p narrow spectrum, obtained by analysis on the hard mask film of Comparative Example 1 formed on another transparent substrate 1 by X-ray photoelectron spectroscopy. FIG. 15 shows a result of depth direction chemical bonding state analysis of O1s narrow spectrum. FIG. 16 shows a result of depth direction chemical bonding state analysis of N1s narrow spectrum. FIG. 17 shows a result of depth direction chemical bonding state analysis of C1s narrow spectrum. FIG. 18 shows a result of depth direction chemical bonding state analysis of Si2p narrow spectrum.

In each depth direction chemical bonding state analysis in FIGS. 14 to 18, a plot "1.60 min" in each figure shows an analysis result at a position in the film thickness direction of the hard mask film after eroding the hard mask film from the uppermost surface for 1.60 min by Ar gas sputtering.

The position in the hard mask film in the film thickness direction after eroding the hard mask film from the uppermost surface for 1.60 min by Ar gas sputtering is a position deeper than the above-mentioned composition gradient portion. Thus, the plot "1.60 min" is a measurement result in the part of the hard mask film excluding the composition gradient portion.

From the analysis result of Cr2p narrow spectrum in FIG. 14, it is understood that the hard mask film in Comparative Example 1 has a maximum peak at a binding energy greater than 574 eV in the region excluding the composition gradient portion. The above-mentioned result means a so-called chemical shift state which is a state where an abundance ratio of chromium atoms which are not bonded to atoms such as nitrogen and oxygen is considerably small. Therefore, resistance against etching based on a chemical reaction is low and side etching is difficult to suppress.

From the analysis result of O1s narrow spectrum in FIG. 15, it is understood that the hard mask film in Comparative Example 1 has a maximum peak at a binding energy of about 530 eV in the region excluding the composition gradient portion. The above-mentioned result means that Cr—O bond exists at a predetermined ratio or more.

From the analysis result of N1s narrow spectrum in FIG. 16, it is understood that the hard mask film in Comparative Example 1 has a maximum peak at a binding energy of about 397 eV in the region excluding the composition gradient portion. The above-mentioned result means that Cr—N bond exists in the hard mask film in Comparative Example 1 at a predetermined ratio or more. Therefore, it may be said that side etching easily progresses.

From the analysis result of C1s narrow spectrum in FIG. 17, it is understood that the hard mask film in Comparative Example 1 has a maximum peak at a binding energy of 283 eV in the region excluding the composition gradient portion. The above-mentioned result means that Cr—C bond exists at a predetermined ratio or more.

From the analysis result of Si2p narrow spectrum in FIG. 18, it is understood that the hard mask film in Comparative Example 1 has a maximum peak of the binding energy which is not higher than a detection lower limit in the region excluding the composition gradient portion. The above-mentioned result means that atoms bonded to silicon, including Cr—Si bond, were not detected in the hard mask film in Comparative Example 1.

Next, using the mask blank in Comparative Example 1, a transfer mask (binary mask) in Comparative Example 1 was manufactured according to a manufacturing process similar to that in Example 1 mentioned above.

In the manner similar to Example 1, in the manufacturing process of the transfer mask in Comparative Example 1, for each of the resist pattern 4a and the hard mask film pattern 3a, the line width was measured by the above-mentioned critical dimension SEM in the region where the line-and-space pattern was formed.

At each of a plurality of positions in the same region where the line-and-space pattern was formed, an etching bias was calculated which was a variation amount between the line width of the resist pattern 4a and the line width of the hard mask film pattern 3a and, furthermore, an average value of etching bias was calculated. As a result, the average value of etching bias was about 27 nm which was relatively large, like in case of dry etching on a conventional chromium-based material film. LWR of the hard mask film pattern 3a was about 7.5 nm which was a relatively large value.

This shows that, also in case where the hard mask film 3 is patterned by the dry etching in the high-bias condition using the resist pattern 4a as a mask and using a mixed gas of a chlorine-based gas and an oxygen gas, it is difficult to suppress the side etching amount generated on a pattern side wall of the hard mask film 3. Therefore, it may not be possible to accurately form a fine pattern on the hard mask film 3. Thus, it is difficult to accurately transfer the fine transfer pattern of the resist pattern 4a to the hard mask film 3.

Furthermore, by using AIMS193 (manufactured by Carl Zeiss), the transfer mask 20 of Comparative Example 1 was subjected to simulation of an exposure transfer image when exposure transfer was carried out onto a resist film on a semiconductor device using exposure light having a wavelength of 193 nm, in the manner similar to Example 1. When the exposure transfer image obtained by the simulation was verified, transfer defect was confirmed. It is presumed that the defect is caused by a factor of insufficient pattern accuracy in a final shielding film pattern, resulting from a large side etching amount of the hard mask film pattern and large LWR (Line Width Roughness).

Comparative Example 2

A mask blank of Comparative Example 2 was prepared in the manner similar to Example 1 except the hard mask film. The hard mask film in Comparative Example 2 was formed in a film forming condition changed from that of the hard mask film 3 in Example 1 as follows.

Specifically, a synthetic quartz substrate provided with the light shielding film 2 comprising the SiN film in Example 1 was placed in a single-wafer DC sputtering apparatus. Using a target comprising chromium, reactive sputtering was carried out in a mixed gas atmosphere of Argon (Ar), nitrogen monoxide (NO), and helium (He) so that the hard mask film comprising a CrON film containing chromium, oxygen, and nitrogen was formed on the light shielding film 2 to the thickness of 9 nm.

In the above-mentioned manner, the mask blank of Comparative Example 2 was prepared.

Next, only the hard mask film in Comparative Example 2 was formed on another transparent substrate 1 and the hard mask film was analyzed by X-ray photoelectron spectroscopy (with RBS correction). As a result, it was confirmed that the hard mask film in Comparative Example 2 had a composition gradient portion (having an oxygen content of 40 atomic % or more) which was formed in a region adjacent to a surface of the hard mask film that faces away from the light shielding film (the region from the surface to the depth of 2 nm) and which had an oxygen content greater than that in the other region. It was also confirmed that, in the region of the hard mask film in Comparative Example 2 excluding the composition gradient portion, the contents of the respective constituent elements were Cr: 58 atomic %, O: 17 atomic %, and N: 25 atomic % in average. Furthermore, it was confirmed that, in the region of the hard mask film excluding the composition gradient portion, a difference in content of each constituent element in the thickness direction was 3 atomic % or less and there was no substantial composition gradient in the thickness direction.

In the manner similar to Example 1, the hard mask film formed on another transparent substrate 1 in Comparative Example 2 was subjected to analysis of X-ray photoelectron spectroscopy to acquire a result of depth direction chemical bonding state analysis of Cr2p narrow spectrum, a result of depth direction chemical bonding state analysis of O1s narrow spectrum, a result of depth direction chemical bonding state analysis of N1s narrow spectrum, a result of depth direction chemical bonding state analysis of C1s narrow spectrum, and a result of depth direction chemical bonding state analysis of Si2p narrow spectrum.

From the analysis result of Cr2p narrow spectrum, it is understood that the hard mask film in Comparative Example 2 has a maximum peak at a binding energy greater than 574 eV in the region excluding the composition gradient portion. The above-mentioned result means a so-called chemical shift state where an abundance ratio of chromium atoms which are not bonded to atoms such as nitrogen and oxygen is considerably small. Therefore, resistance against etching based on the chemical reaction is low and side etching is difficult to suppress.

From the analysis result of O1s narrow spectrum, it is understood that the hard mask film in Comparative Example 2 has a maximum peak at a binding energy of about 530 eV in the region excluding the composition gradient portion. The above-mentioned result means that Cr—O bond exists at a predetermined ratio or more.

From the analysis result of N1 s narrow spectrum, it is understood that the hard mask film in Comparative Example 2 has a maximum peak at a binding energy of about 397 eV in the region excluding the composition gradient portion. The above-mentioned result means that Cr—N bond exists in the hard mask film in Comparative Example 2 at a predetermined ratio or more. Therefore, it may be said that side etching easily progresses.

From the analysis result of C1s narrow spectrum, it is understood that the hard mask film in Comparative Example 2 has a maximum peak of the binding energy which is not higher than a detection lower limit in all regions in the thickness direction. The above-mentioned result means that atoms bonded to carbon, including Cr—C bond, were not detected in the hard mask film in Comparative Example 2.

From the analysis result of Si2p narrow spectrum, it is understood that the hard mask film in Comparative Example 2 has a maximum peak of the binding energy which is not higher than a detection lower limit in all regions in the thickness direction. The above-mentioned result means that atoms bonded to silicon, including Cr—Si bond, were not detected in the hard mask film in Comparative Example 2.

Next, using the mask blank in Comparative Example 2, a transfer mask (binary mask) in Comparative Example 2 was manufactured according to the manufacturing process similar to that in Example 1 mentioned above.

In the manufacturing process of the transfer mask in Comparative Example 2, for each of the resist pattern 4a and the hard mask film pattern 3a, the line width was measured by the above-mentioned critical dimension SEM in the region where the line-and-space pattern was formed.

At each of a plurality of positions in the same region where the line-and-space pattern was formed, an etching bias was calculated which was a variation amount between the line width of the resist pattern 4a and the line width of the hard mask film pattern 3a and, further, an average value of etching bias was calculated. As a result, the average value of etching bias was about 30 nm which was substantially large, as compared with the case of dry etching on a conventional chromium-based material film. LWR of the hard mask film pattern 3a was about 8 nm which was a relatively large value.

This shows that, in the mask blank of Comparative Example 2, in case where the hard mask film 3 is patterned by the dry etching in the high-bias condition using the resist pattern 4a as a mask and using a mixed gas of a chlorine-based gas and an oxygen gas, it is difficult to suppress the side etching amount generated on a pattern side wall of the hard mask film 3. Therefore, it may not be possible to accurately form a fine pattern on the hard mask film 3. Therefore, it is difficult to accurately transfer the fine transfer pattern of the resist pattern 4a to the hard mask film 3.

Furthermore, by using AIMS193 (manufactured by Carl Zeiss), the transfer mask of Comparative Example 2 was subjected to simulation of an exposure transfer image when exposure transfer was carried out onto a resist film on a semiconductor device using exposure light having a wavelength of 193 nm, in the manner similar to Example 1. When the exposure transfer image obtained by the simulation was verified, transfer defect was confirmed. It is presumed that the defect is caused by a factor of insufficient pattern accuracy in a final shielding film pattern, resulting from a large side etching amount of the hard mask film pattern and large LWR.

While the embodiments and the examples of this disclosure have thus far been described, they are merely for illustration purpose and do not limit the scope of the claims. The techniques described in the claims encompass modifications and alterations of the specific examples illustrated in the foregoing.

EXPLANATION OF REFERENCE NUMERALS 1 transparent substrate
2 light shielding film
3 hard mask film
4 resist film
10, 12 mask blank
20 transfer mask (binary mask)

The invention claimed is:

1. A mask blank comprising:
a transparent substrate;
a light shielding film formed on the transparent substrate and made of a material containing one or more elements selected from silicon and tantalum; and
a hard mask film formed on the light shielding film and made of a material containing chromium, oxygen, and carbon,
wherein the hard mask film is a single layer film having a composition gradient portion formed on a surface of the hard mask film that faces away from the light shielding film and in a region adjacent to the surface, and
wherein the hard mask film has a maximum peak of N1s narrow spectrum, obtained by analysis of X-ray photoelectron spectroscopy, which is not higher than a lower detection limit, and
wherein a part of the hard mask film excluding the composition gradient portion has a chromium content of 50 atomic % or more, and
wherein the part of the hard mask film excluding the composition gradient portion has a maximum peak of Cr2p narrow spectrum, obtained by analysis of X-ray photoelectron spectroscopy, at a binding energy of 574 eV or less.

2. The mask blank according to claim 1, wherein, in the part of the hard mask film excluding the composition gradient portion, a ratio of carbon content [atomic %] to total content [atomic %] of chromium, carbon, and oxygen is 0.1 or more.

3. The mask blank according to claim 1, wherein the composition gradient portion of the hard mask film has a maximum peak of Cr2p narrow spectrum, obtained by analysis of X-ray photoelectron spectroscopy, at a binding energy of 576 eV or more.

4. The mask blank according to claim 1, wherein the hard mask film has a maximum peak of Si2p narrow spectrum, obtained by analysis of X-ray photoelectron spectroscopy, which is not higher than a lower detection limit.

5. The mask blank according to claim 1, wherein the part of the hard mask film excluding the composition gradient portion has a chromium content of 80 atomic % or less.

6. The mask blank according to claim 1, wherein the part of the hard mask film excluding the composition gradient portion has a carbon content of 10 atomic % or more and 20 atomic % or less.

7. The mask blank according to claim 1, wherein the part of the hard mask film excluding the composition gradient portion has an oxygen content of 10 atomic % or more and 35 atomic % or less.

8. The mask blank according to claim 1, wherein the part of the hard mask film excluding the composition gradient portion has a difference in content of each constituent element, along a direction that is orthogonal to the surface, that is less than 10 atomic %.

9. The mask blank according to claim 1, wherein the light shielding film has an optical density not smaller than 2.8 with respect to exposure light having a wavelength of 193 nm.

10. The mask blank according to claim 1, wherein the light shielding film has a thickness of 60 nm or less.

11. The mask blank according to claim 1, wherein the hard mask film has a thickness of 15 nm or less.

12. A method for using the mask blank according to claim 1 to manufacture a transfer mask, the method comprising:
    performing a first dry etching to form a transfer pattern on the hard mask film, wherein a mask used for the first dry etching is a resist film having the transfer pattern and wherein a gas used for the first dry etching is a mixed gas of a chlorine-based gas and an oxygen gas; and
    performing a second dry etching to form the transfer pattern on the light shielding film, wherein a mask used for the second dry etching is the hard mask film provided with the transfer pattern and wherein a gas used for the second dry etching is a fluorine-based gas.

13. The method according to claim 12, wherein, in the part of the hard mask film excluding the composition gradient portion:
    a chromium content is 80 atomic % or less;
    a carbon content is 10 atomic % or more and 20 atomic % or less;
    an oxygen content is 10 atomic % or more and 35 atomic % or less; and
    a ratio of carbon content [atomic %] to total content [atomic %] of chromium, carbon, and oxygen is 0.1 or more.

14. The method according to claim 12, wherein, for each element in the group consisting of chromium, carbon, and oxygen, the part of the hard mask film excluding the composition gradient portion has a difference in content of the element, along a direction that is orthogonal to the surface, that is less than 10 atomic %.

15. The method according to claim 14, wherein the composition gradient portion of the hard mask film has a maximum peak of Cr2p narrow spectrum, obtained by analysis of X-ray photoelectron spectroscopy, at a binding energy of 576 eV or more.

16. The method according to claim 12, wherein the light shielding film has a thickness of 60 nm or less, and wherein the hard mask film has a thickness of 15 nm or less.

17. A method for manufacturing a semiconductor device, comprising:
    using the mask blank according to claim 1 to manufacture a transfer mask, comprising:
        performing a first dry etching to form a transfer pattern on the hard mask film, wherein a mask used for the first dry etching is a resist film having the transfer pattern and wherein a gas used for the first dry etching is a mixed gas of a chlorine-based gas and an oxygen gas; and
        performing a second dry etching to form the transfer pattern on the light shielding film, wherein a mask used for the second dry etching is the hard mask film provided with the transfer pattern and wherein a gas used for the second dry etching is a fluorine-based gas; and
    using the transfer mask to exposure-transfer the transfer pattern onto a resist film on a semiconductor substrate.

18. The method according to claim 17, wherein, in the part of the hard mask film excluding the composition gradient portion:
    a chromium content is 80 atomic % or less;
    a carbon content is 10 atomic % or more and 20 atomic % or less;
    an oxygen content is 10 atomic % or more and 35 atomic % or less; and
    a ratio of carbon content [atomic %] to total content [atomic %] of chromium, carbon, and oxygen is 0.1 or more.

19. The method according to claim 17, wherein, for each element in the group consisting of chromium, carbon, and oxygen, the part of the hard mask film excluding the composition gradient portion has a difference in content of the element, along a direction that is orthogonal to the surface, that is less than 10 atomic %.

20. A method of providing a mask blank, comprising:
    forming, on a transparent substrate, a light shielding film made of a material containing one or more elements selected from silicon and tantalum; and
    forming, on the light shielding film, a hard mask film made of a material containing chromium, oxygen, and carbon,
    wherein the hard mask film is a single layer film having a composition gradient portion formed on a surface that faces away from the light shielding film and in a region adjacent to the surface, and
    wherein the hard mask film has a maximum peak of N1s narrow spectrum, obtained by analysis of X-ray photoelectron spectroscopy, which is not higher than a lower detection limit, and
    wherein a part of the hard mask film excluding the composition gradient portion has a chromium content of 50 atomic % or more, and
    wherein the part of the hard mask film excluding the composition gradient portion has a maximum peak of Cr2p narrow spectrum, obtained by analysis of X-ray photoelectron spectroscopy, at a binding energy of 574 eV or less.

* * * * *